United States Patent
Qian et al.

(10) Patent No.: US 6,339,288 B1
(45) Date of Patent: Jan. 15, 2002

(54) CIRCUIT BOARD FOR ORGANIC ELECTROLUMINESCENT PANEL, METHOD OF MANUFACTURE, AND ELECTROLUMINESCENT PANEL

(75) Inventors: Yifan Qian; Mamoru Ishizaki; Takeshi Itoi; Mizuhiro Tani; Takao Minato; Yuichi Ito; Teruhiko Kai, all of Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 09/403,717

(22) PCT Filed: Feb. 24, 1999

(86) PCT No.: PCT/JP99/00846

§ 371 Date: Oct. 22, 1999

§ 102(e) Date: Oct. 22, 1999

(87) PCT Pub. No.: WO99/44395

PCT Pub. Date: Sep. 2, 1999

(30) Foreign Application Priority Data

| Feb. 25, 1998 | (JP) | 10-43638 |
| Apr. 27, 1998 | (JP) | 10-117236 |
| Sep. 1, 1998 | (JP) | 10-247412 |

(51) Int. Cl.[7] .............................. H01J 1/62; H01J 63/04
(52) U.S. Cl. ...................... 313/498; 313/504; 313/500; 313/505; 313/506; 445/24
(58) Field of Search ........................... 313/496, 498, 313/500–512, 311; 428/690, 917; 315/169.3; 445/24; 430/23, 24, 25, 26, 27, 28, 29

(56) References Cited

U.S. PATENT DOCUMENTS

| 4,468,589 A | * | 8/1984 | Hikida et al. ............... 313/496 |
| 4,472,658 A | * | 9/1984 | Morimoto et al. ........... 313/497 |
| 5,278,544 A | * | 1/1994 | Leroux ....................... 313/495 |
| 5,453,659 A | * | 9/1995 | Wallace et al. .............. 313/495 |
| 5,641,611 A | * | 6/1997 | Shieh et al. ................... 430/23 |
| 5,667,655 A | * | 9/1997 | Libman et al. ................ 430/23 |
| 5,701,055 A | * | 12/1997 | Nagayama et al. ......... 313/504 |
| 5,773,931 A | * | 6/1998 | Shi et al. ..................... 313/509 |
| 5,804,917 A | * | 9/1998 | Takahashi et al. .......... 313/504 |
| 5,952,782 A | * | 9/1999 | Nanto et al. ................. 313/584 |
| 5,955,226 A | * | 9/1999 | Matsuda et al. .............. 430/25 |
| 5,962,970 A | * | 10/1999 | Yokoi et al. ................. 313/506 |
| 5,989,649 A | * | 11/1999 | Itou et al. ...................... 430/27 |
| 6,005,344 A | * | 12/1999 | Fleming ...................... 313/498 |
| 6,037,712 A | * | 3/2000 | Codama et al. ............. 313/498 |
| 6,043,605 A | * | 3/2000 | Park ........................... 313/586 |

FOREIGN PATENT DOCUMENTS

| EP | 0 767 599 A2 | 10/1996 |
| EP | 888035 A1 | 12/1998 |
| JP | 8-315981 A | 11/1996 |
| JP | 9-330792 A | 12/1997 |
| JP | 10-74585 A | 3/1998 |
| JP | 10-106747 A | 4/1998 |
| JP | 11-40354 A | 1/1999 |
| WO | 97/34447 A1 | 9/1997 |

* cited by examiner

*Primary Examiner*—Nimeshkumar D. Patel
*Assistant Examiner*—Mariceli Santiago
(74) *Attorney, Agent, or Firm*—Burns, Doane, Swecker & Mathis, LLP

(57) ABSTRACT

A substrate for an organic electroluminescence display element comprises a support (11), a plurality of first electrode lines (12) arranged apart from each other on the support (11), and a plurality of partition walls (13) arranged apart from each other and extending in a direction to cross the first electrode lines (12). Each of the partition walls (13) has eaves in an upper portion and flared side surfaces in a lower portion.

51 Claims, 16 Drawing Sheets

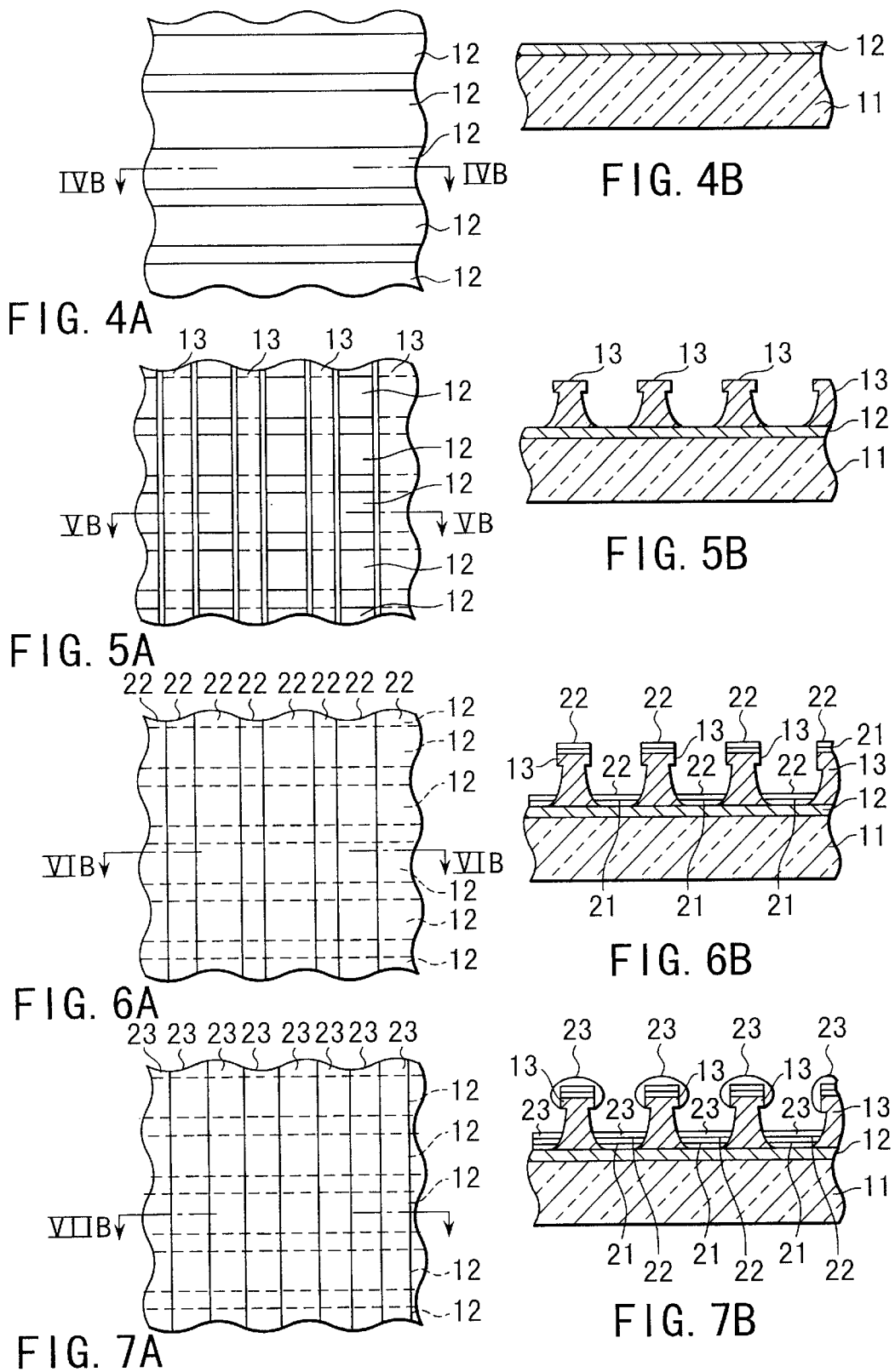

CIRCUIT BOARD FOR ORGANIC ELECTROLUMINESCENT PANEL, METHOD OF MANUFACTURE, AND ELECTROLUMINESCENT PANEL

TECHNICAL FIELD

The present invention relates to a substrate for an organic electroluminescence display element, which is a light emission type display for a domestic television receiver and a terminal display device for a high information processing, a method of manufacturing the same, and an organic electroluminescence display element.

In the following description, the "electro-luminescence" element is often referred to as "EL" element.

BACKGROUND ART

An organic EL display element, which is one of flat panel type display devices, is constructed basically such that an organic EL medium layer is sandwiched between a first electrode (anode or cathode) and a second electrode (cathode or anode). Light is emitted by allowing an electric current to flow between the two electrodes. The organic EL display element is of a self-light emission type and, thus, exhibits a high brightness and a wide viewing angle. In addition, the display element can be driven under a low voltage. In general, each of the first and second electrodes consists of a plurality of electrode lines that are arranged such that the first electrode lines and the second electrode lines cross each other to form a matrix structure. That portion of the organic EL medium layer which is positioned at the intersection between the first electrode line and the second electrode line constitutes a pixel.

In order to manufacture a large capacity and high precision organic EL display element having a matrix electrode structure, a very fine patterning treatment must be applied to the electrode line.

In general, a photolithography method or a masked vapor deposition method is known as a method for forming a fine pattern of a thin film.

However, if the second electrode layer is patterned by the photolithography method, the solvent of the photoresist or the developing solution permeates into the underlying layer of the organic EL medium layer so as to bring about rupture or deterioration of the element.

On the other hand, in the case of the masked vapor deposition method, it is important to pay attentions to the bonding strength between the vapor deposition mask and the substrate. If the bonding strength is unsatisfactory, the evaporated material is partly deposited on the back side of the vapor deposition mask pattern so as to lower the resolution. If the vapor deposition mask is forcedly bonded to the substrate in an attempt to avoid the difficulty noted above, the organic EL medium layer itself is scratched.

A method for finely patterning the second electrode line without imparting damage to the organic EL medium layer is disclosed in Japanese Patent Disclosure (Kokai) No. 5-258859 and Japanese Patent Disclosure No. 5-258860. Specifically, disclosed is a technology of oblique vapor deposition of an organic EL medium and a metal using a plurality of partition walls. In this method, a plurality of partition walls are formed to cross the anode pattern, followed by obliquely applying vapor deposition for forming the organic EL medium layer and the cathode in the order mentioned. In this method, lamination and patterning of the organic EL medium and the cathode material are carried out simultaneously. In this method, however, it is difficult to carry out the vapor deposition while rotating the substrate and to control uniformly the directions of the vapor deposition beams over a large area. In addition, the anode pattern is limited to a linear pattern.

An improvement of the partition wall oblique or slant vapor deposition method outlined above is disclosed in Japanese Patent Disclosure No. 8-315981 and Japanese Patent Disclosure No. 9-102393. In the method disclosed in these prior arts, used is a partition wall having an overhanging structure (inversely tapered partition wall or a partition wall having a T-shaped cross section). The particular partition wall is mounted to the substrate having a first electrode line formed thereon. These conventional partition wall methods make it possible in principle to carry out the vapor deposition and patterning of the organic EL medium and the second electrode line simultaneously by utilizing the presence of the partition wall. It should be noted that, since the partition wall has an overhanging structure, the patterning can be performed by the vapor deposition in a direction perpendicular to the substrate, with the result that the vapor deposition can be performed while rotating the substrate.

However, in the case of using an inversely tapered partition wall, it is possible for the incident angle of the vapor deposition beam to be smaller than the tapered angle. In this case, deposition takes place also on the side wall of the partition wall, leading to possibility of short-circuiting between the two electrodes. It follows that the method using an inversely tapered partition wall is not adapted for the vapor deposition on a substrate having a large area. On the other hand, complex steps are required for forming a partition wall having a T-shaped cross section. Further, since there is a clearance between the partition wall and the organic EL medium layer, a difficulty is brought about if vapor deposition of the organic EL medium and the second electrode material are carried out by using the partition wall. Specifically, the second electrode material is also deposited on the region where the organic EL medium layer is not present. As a result, the second electrode is brought into direct contact with the first electrode, leading to short-circuiting that impairs the normal operation of the device. Even if the second electrode material is selectively deposited on the organic EL medium so as to prevent the short-circuiting, electric field is concentrated in the vicinity of the end portion of the second electrode in which the organic EL medium is laminated thin or in the edge portion of the second electrode line so as to bring about deterioration caused by insulation breakdown or Joule heat. For preventing these problems, it is proposed to form an electric insulating layer in the base portion of the partition wall. However, formation of the insulating layer makes the manufacturing process complex. Further, since the edge portion of the organic EL medium layer/second electrode line is exposed to the outside, deterioration tends to take place from the edge portion. In addition, since a clearance is provided between the partition wall and the organic EL medium layer/second electrode line, or since light is transmitted through the partition wall, the light coming from the back surface of the substrate runs through the clearance or the partition wall to reach the display surface so as to inhibit the display.

A second problem relating to the organic EL display element is that the resistance of the anode line is increased as the anode line is made finer. If the resistance of the anode line is increased, the voltage drop caused by the resistance of the anode line is increased in the case where a current required for obtaining a sufficient brightness is allowed to flow through the anode line. As a result, a high driving voltage is required. Even in the voltage driving type device such as a liquid crystal display device or an AC type inorganic EL display element, it is necessary to decrease the resistance of the electrode line including a transparent conductor film in order to make the display characteristics uniform over the entire display panel. When it comes to a current driving type element such as a organic EL display element, it is more necessary to decrease the resistance.

Various techniques for decreasing the resistance of the anode line are disclosed in, for example, Japanese Patent Disclosure No. 10-106751 and Japanese Patent Disclosure No. 9-230318. Specifically, Japanese Patent Disclosure No. 10-106751 teaches that conductive metal lines are formed in contact with both side surfaces of a transparent electrode line so as to decrease the resistance of the anode line. In this case, however, the height of the conductive metal line is limited by the height of the transparent electrode line, making it difficult to further decrease the resistance of the anode line, though the resistance can be lowered to some extent.

On the other hand, Japanese Patent Disclosure No. 9-230318 teaches that the clearance between adjacent metal wirings is filled with an ultraviolet (UV) curing resin for the flattening purpose. However, since patterning of a transparent electrode is required in this method, the manufacturing process is rendered complex. Also, what should be particularly pointed out in this case is that, when the transparent electrode material is patterned with an etchant, the metal wiring is unavoidably corroded by the etchant. It is certainly possible to prevent the metal wiring from being corroded by allowing the side edge of the transparent electrode line to extend over the metal wiring so as to cover the adjacent UV curing resin. However, if a color display is to be obtained by the particular construction, it is impossible to obtain display of pure colors because colors are mixed.

A third problem relating to the organic EL display element is that the organic EL medium layer and the second electrode line are deteriorated.

Specifically, the organic EL medium layer and the second electrode line are deteriorated by the water, oxygen, etc. contained in the atmosphere. In order to prevent the second electrode and the organic EL medium from being deteriorated by the water, oxygen, etc., the second electrode line and the organic EL medium are sealed by a cover covering the second electrode line and the organic EL medium. For example, a box-shaped cover covering the second electrode line and the organic EL medium is bonded to the substrate under vacuum or under an inert gas atmosphere so as to hermetically seal the second electrode line and the organic EL medium.

However, some problems are brought about in the case of using a cover. First of all, when the box-shaped cover is mounted to the substrate, it is possible for the bottom surface of the cover wall to be brought into direct contact with the second electrode line so as to cause short-circuiting. It is also possible for the second electrode or the organic EL medium layer to be scratched by the bottom surface of the cover wall so as to cause short-circuiting or a poor light emission.

It should also be noted that the bottom surface of the cover wall facing the front surface of the substrate is coated with an adhesive for bonding the box-shaped cover to the substrate. Since the adhesive exhibits a fluidity, the adhesive layer is partly moved so as to contact the organic EL medium layer or the second electrode line. As a result, the organic EL medium layer or the second electrode line is deteriorated.

An object of the present invention is, therefore, to overcome at least one of the above-noted problems inherent in the conventional techniques.

To be more specific, a first object of the present invention is to provide a substrate for an organic EL display element having an improved partition wall structure that can be manufactured without making the structure complex and without imposing a big limitation to the manufacturing process, a method of manufacturing the same, and an organic EL display element.

A second object of the present invention is to provide a substrate for an organic EL display element that permits lowering the electric resistance of the anode line in an organic EL display element having a large display screen of a high fineness, an organic EL display element, and a method of manufacturing the same.

Further, a third object of the present invention is to provide a substrate for an organic EL display element that permits preventing the second electrode line and the organic EL medium layer from being damaged and deteriorated and also permits sealing easily these second electrode line and the organic EL medium layer and an organic EL display element.

DISCLOSURE OF INVENTION

The first object of the present invention is achieved according to a first aspect of the present invention by a substrate for an organic EL display element, comprising, on a support, a plurality of first electrode lines arranged apart from each other, and a plurality of partition walls arranged apart from each other and extending in a direction to cross the first electrode lines, each of the partition walls having eaves in an upper portion and flared side surfaces in a lower portion.

The substrate according to the first aspect of the present invention can be manufactured by coating a support having a plurality of first electrode lines formed thereon with a negative photoresist layer; for the negative photoresist layer, applying light exposure to expose a plurality of regions corresponding to top portions including eaves of the partition walls to light; and subsequently developing the non-exposed portion. After the development, it is desirable to perform post-baking in the present invention after irradiation with an electron beam or a UV light.

Alternatively, the substrate according to the first aspect of the present invention can be manufactured preferably by forming a negative photoresist layer on a support having first electrode lines formed thereon; for the negative photoresist layer, applying, simultaneously or one before the other, a first light exposure to expose a plurality of first regions corresponding to top portions including eaves of partition walls to light, and a second light exposure to expose a plurality of second regions corresponding to at least the flared lower end portions of the partition walls to light; and developing the non-exposed portion to form the partition walls.

Alternatively, the substrate according to the first aspect of the present invention can be manufactured preferably by forming a negative photoresist layer on a support having first electrode lines formed thereon; for the negative photoresist layer, applying, simultaneously or one before the other, a first light exposure to expose a plurality of regions corresponding to top portions including eaves of partition walls to light, and a second light exposure to expose regions corresponding to the bottoms of the partition walls to light; and developing the nonexposed portion to form the partition walls.

Further, the substrate according to the first aspect of the present invention can be manufactured preferably by forming a negative photoresist layer on a support having first electrode lines formed thereon; and, for the negative photoresist layer, applying a first light exposure to expose a plurality of first regions corresponding to top portions including eaves of partition walls to light, developing the non-exposed portion in a predetermined thickness, then applying a second light exposure to expose a plurality of second regions corresponding to the flared lower end portions of the partition walls to light, and developing the non-exposed portion to form the partition walls.

In the substrate for an organic EL display element in a preferred embodiment according to the first aspect of the present invention, the adjacent partition walls are connected to each other at the flared lower end portions by a plurality of connection bands.

The particular substrate of the preferred embodiment can be manufactured by exposing also a region connecting adjacent partition walls to light in the second light exposure step included in the method of manufacturing a substrate for an organic EL display element according to the first aspect.

The substrate for an organic EL display element in a preferred embodiment of the first aspect can also be manufactured by utilizing a plurality of color filters arranged on a support. To be more specific, the particular substrate can be manufactured by arranging a plurality of color filters apart from each other on a support to form rows and columns of the color filters; forming a plurality of first electrode lines apart from each other on the color filters in a manner to extend in the row direction of the color filters; forming a negative photoresist layer on the first electrode lines; for the negative photoresist layer, applying, simultaneously or one before the other, a first light exposure to first regions corresponding to the top portions including eaves of the partition walls, and a second light exposure, with the color filters used as a mask, to second regions corresponding to the bottom portions of the partition walls positioned between adjacent columns of the color filters and third regions positioned between adjacent rows of the color filters, from rear side of the support; and developing the non-exposed portion to form partition walls connected to each other by a connection band corresponding to the third region.

The second object of the present invention is achieved according to a second aspect of the present invention by a substrate for an organic electroluminescence display element, comprising, on a support, a plurality of first electrode lines arranged apart from each other on the support, and a plurality of conductive bus lines extending substantially in parallel to the first electrode lines, the first electrode lines being arranged apart from the support and one side edge portion of the first electrode line extending over the surface of the adjacent conductive bus line.

The substrate for an organic EL display element according to the second aspect of the present invention can be manufactured by forming a plurality of electrically insulating layers that are inversely tapered on a support; forming an electrically conductive material layer on substantially the entire surface of the support having the insulating layers formed thereon; forming a plurality of electrically conductive bus lines each connected to only one side edge of each of the insulating layers by removing that portion of the conductive material layer which is positioned on the insulating layer such that the conductive material layer remaining on the surface of the support is in contact with the one side edge of the insulating layer and is separated from the other side edge of the insulating layer; and forming a plurality of first electrode lines by forming a first electrode layer on the support having the insulating layers and the conductive bus lines formed thereon, each of the first electrode lines being positioned on the insulating layer and extending over the conductive bus line connected to the insulating layer, and the plural first electrode layers being separated from each other at the other edges of the insulating layers.

The third object of the present invention is achieved according to a third aspect of the present invention by a substrate for an organic EL display element, comprising, on a support, a plurality of first electrode lines arranged apart from each other on the support, a plurality of partition walls arranged apart from each other and extending in a direction to cross the first electrode lines, and a frame on which a cover is disposed, the frame being arranged to surround the plural partition walls.

The present invention also provides an organic electroluminescence display element comprising a substrate for an organic EL display element according to the present invention, and an organic EL medium and second electrode lines, formed on the substrate.

Further developments of the present invention are defined in the appended claims.

BRIEF DESCRIPTION OF DRAWINGS

FIG. 4A is a top view which schematically shows a substrate for an organic EL display element of the present invention and a method of manufacturing an organic EL display element of the present invention;

FIG. 4B is a cross-sectional view along line IVB—IVB shown in FIG. 4A, wherein FIG. 4B schematically shows a substrate for an organic EL display element of the present invention and a method of manufacturing an organic EL display element of the present invention;

FIG. 5A is a top view which schematically shows a substrate for an organic EL display element of the present invention and a method of manufacturing an organic EL display element of the present invention;

FIG. 5B is a cross-sectional view along line VB—VB shown in FIG. 5A, in which FIG. 5B schematically shows a substrate for an organic EL display element of the present invention and a method of manufacturing an organic EL display element of the present invention;

FIG. 6A is a top view which schematically shows a substrate for an organic EL display element of the present invention and a method of manufacturing an organic EL display element of the present invention;

FIG. 6B is a cross-sectional view along line VIB—VIB shown in FIG. 6A, which schematically shows a substrate for an organic EL display element of the present invention and a method of manufacturing an organic EL display element of the present invention;

FIG. 7A is a top view which schematically shows a substrate for an organic EL display element of the present invention and a method of manufacturing an organic EL display element of the present invention;

FIG. 7B is a cross-sectional view along line VIIB—VIIB shown in FIG. 7A, wherein FIG. 7B schematically shows a substrate for an organic EL display element of the present invention and a method of manufacturing an organic EL display element of the present invention;

BEST MODE OF CARRYING OUT THE INVENTION

Figure 1:
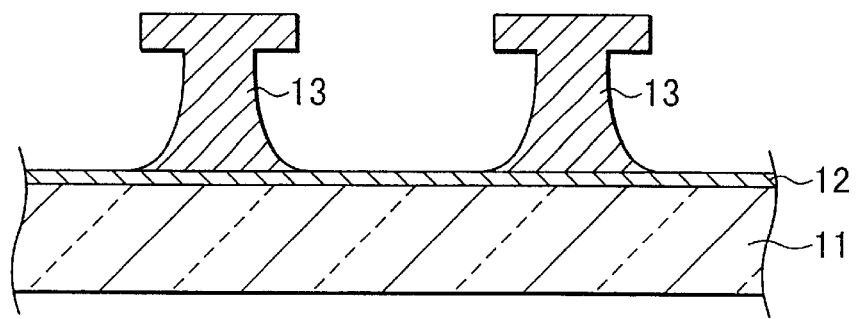
FIG. 1 is a cross sectional view showing a gist portion of a substrate for an organic EL display element of the present invention.

The present invention will now be described with reference to the accompanying drawings. Throughout the drawings, the same portions or members are denoted by the same reference numerals. The following description is directed mainly to the structure in which the first and second electrodes constitute the anode and the cathode, respectively. However, the present invention can be applied similarly to the structure in which the first and second electrodes constitute the cathode and the anode, respectively.

First, the basic structure of a substrate for an organic EL display element of the present invention will be described with reference to FIG. 1. FIG. 1 relates to a structure in which a first electrode constitutes an anode, while a second electrode constitutes a cathode, and shows a cross section along a first electrode line.

As shown in FIG. 1, a substrate for an organic EL display element of the present invention comprises a plurality of first electrode lines 12 arranged apart from each other on a support 11 (single first electrode line 12 alone being shown in FIG. 1). A plurality of partition walls 13 (two partition walls alone being shown in FIG. 1) are arranged apart from each other in a direction crossing the first electrode lines 12.

The support 11, which is transparent and electrically insulating, can be formed of, for example, quartz, glass, or a transparent plastic material.

The first electrode line 12, which constitutes an anode line in FIG. 1, can be formed of a transparent conductive material, preferably, an indium tin compound oxide (ITO), an indium zinc compound oxide, or an indium aluminum compound oxide.

The partition wall 13 serves to separate second electrode lines, which are formed later, from each other. The partition wall 13 of the present invention has an upper eaves portion and a lower flare portion. The partition wall 13 can be formed of preferably a negative photoresist.

Figure 2:
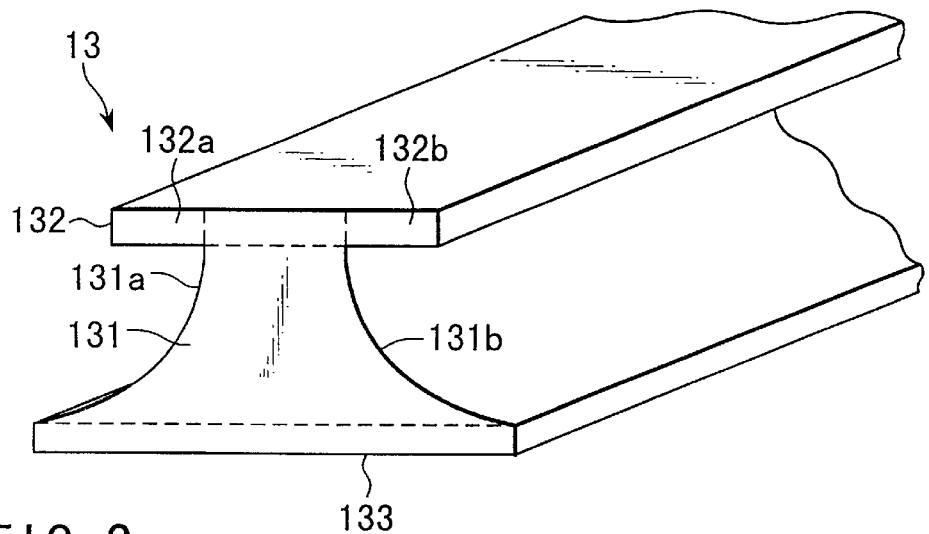
FIG. 2 is an oblique view showing partially a partition wall of the present invention.
Figure 3:
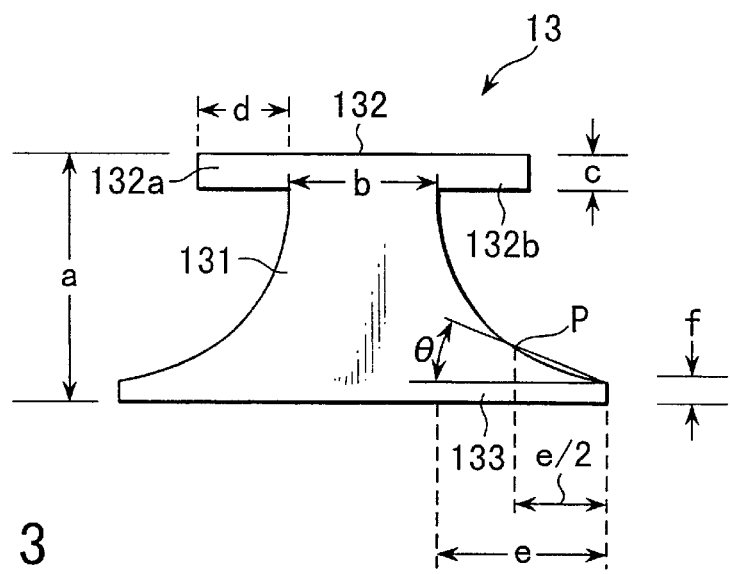
FIG. 3 shows in detail the construction of a partition wall of the present invention.

FIGS. 2 and 3 show the construction of the typical partition walls of the present invention. Specifically, FIG. 2 is an oblique view partially showing the partition wall, and FIG. 3 is a cross sectional view of the partition wall.

The partition wall 13 has a slender or elongated rail-like solid shape as a whole, and, though having an integral structure, can be divided in concept into a striped top portion 132 constituting eaves 132a, 132b, a striped bottom portion 133, and a body portion 131 interposed between the top portion 132 and the bottom portion 133 and shaped like a mountain in cross section to constitute a flare. The mountain-shaped body portion 131 has moderately curved side surfaces 131a, 131b extending from the proximal end portion of each of the eaves 132a, 132b in the lower surface of the top portion 132 to reach the edges in the width direction of the upper surface of the bottom portion 133.

Referring to FIG. 3, the partition wall 13 has a height a of preferably 0.2 μm to 100 μm, more preferably 1 μm to 30 μm. The mountain-shaped body portion 131 has a width b on the upper surface (difference between the entire width of the top portion 132 and the sum of the widths of the eaves 132a, 132b) of preferably 0.05 μm or more, more preferably 1 μm or more. Each of the eaves 132a, 132b has a thickness c of preferably 0.05 μm to 10 μm, more preferably 0.1 μm to 5 μm, and a width d of preferably 0.05 μm to 50 μm, more preferably 0.5 μm to 10 μm. The flare has a width e of preferably 0.1 μm to 100 μm, more preferably 1 μm to 30 μm. Further, it is desirable for the width e of the flare to be 0.1 to 10 times, more desirably 0.5 to 3 times, as large as the height a of the partition wall. Incidentally, the width of the bottom portion 133 should desirably be larger than the width of the top portion 132. In other words, the width e of the flare should desirably be larger than the width d of the eaves.

Further, an angle (this angle is referred to as flare edge angle in this specification) θ made between the upper surface of the bottom portion and a straight line connecting the each front edge of the flare (corresponding to each edge of the bottom portion 133 in its thickness direction) with p at which a vertical line extending upward from the center or half of the flare in the horizontal direction crosses the curved side surface 131b is desirably 45° or less (see FIG. 3).

The partition wall of the present invention has a flare in addition to eaves, making it possible to overcome the problems inherent in the prior art while maintaining the advantages of the prior art. Specifically, an organic EL medium layer can be formed to extend over the flare of the partition wall without forming a clearance between the organic EL medium layer and the partition wall, and the second electrode lines formed thereon can be formed on the organic EL medium layer to extend over the flare of the partition wall. Thus, short-circuiting and insulation breakdown caused by the presence of a clearance around the partition wall, as well as, the problem of light transmission can be avoided. In addition, the restriction in the running direction of the vapor deposition beam can be markedly alleviated, making it possible to use a substrate having a large area and to rotate the substrate in the vapor deposition step. Further, it is possible to avoid the problem of light transmission within the partition wall by mixing a coloring material into the partition wall.

A substrate for an organic EL display element constructed as shown in FIG. 1 and a method of manufacturing an organic EL display element using the particular substrate will now be described with reference to FIGS. 4A to 7B.

In the first step, a plurality of striped first electrode lines 12 (anode lines in this embodiment) are formed, together with a plurality of terminal pads (not shown) as required, on a support 11, as shown in FIGS. 4A and 4B. In this step, it is possible to form a plurality of external lead electrodes (not shown) used for second electrode lines in the subsequent step. FIGS. 4A and 4B show the plural first electrode lines 12 as being arranged a predetermined distance apart from each other.

The plural first electrode lines 12 can be formed by forming a first electrode material on the entire upper surface of the support 11, followed by patterning the first electrode material layer by, for example, the ordinary photolithography technology. In this embodiment, the first electrode constitutes the anode as described above. Therefore, a transparent conductive material, preferably indium tin compound oxide (ITO), indium zinc compound oxide, zinc aluminum compound oxide, etc., can be used as the electrode material. These electrode materials can be formed on the support 31 by means of sputtering method.

Next, partition walls 13 are formed in a manner to cross the first electrode lines, as shown in FIGS. 5A and 5B, thereby preparing a substrate for an organic EL display element of the present invention.

The partition wall 13 has eaves and a flare. Thus, the restriction in the running direction of the evaporated material that is to be deposited can be markedly moderated, as described previously. It follows that it is possible to use a support having a large area and to rotate the support. FIGS. 5A and 5B show that the partition wall is formed linear. However, it is possible to form a curved or folded partition wall in the present invention.

Figure 8A:
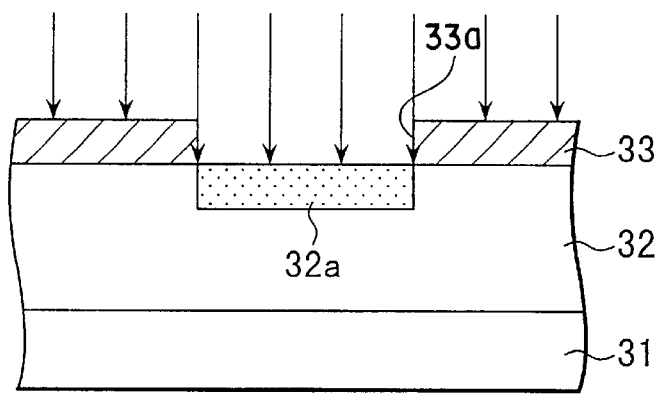
FIGS. 8A to 8D are cross sectional views schematically showing the principle for forming the partition wall of the present invention.
Figure 8B:
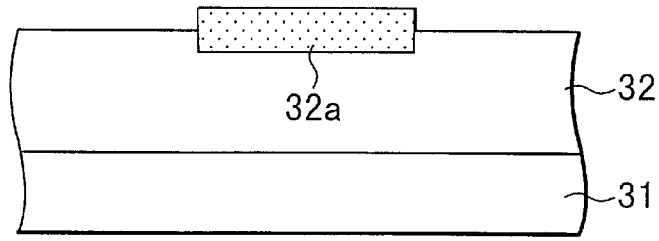
Figure 8C:
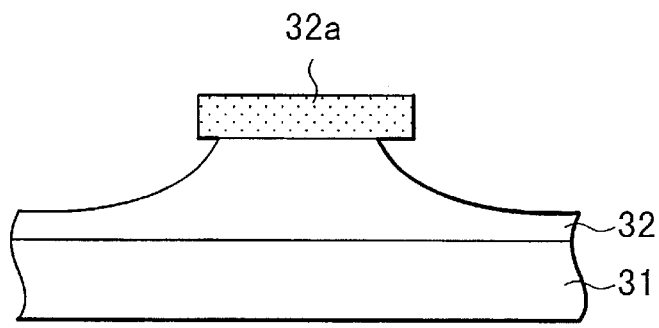
Figure 8D:
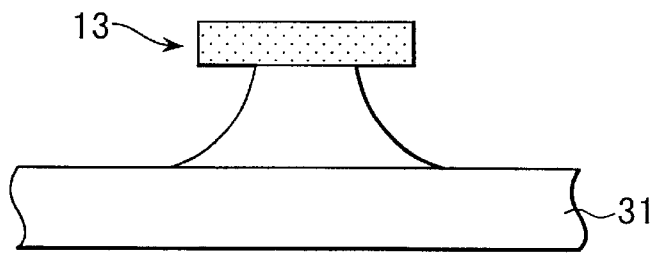

The principle of forming the partition wall 13 will now be described with reference to FIGS. 8A to 8D. As shown in FIG. 8A, a negative resist layer 32 containing a UV-absorbing substance or a coloring material is formed substantially on the entire surface of a substrate 31 (which corresponds to the support 11 having the first electrode lines 12 formed thereon as shown in FIG. 4A), followed by exposing the resist layer 32 to a UV light (denoted by arrows in the FIGURE), using a photo mask 33 having light transmitting portions 33a arranged at an appropriate pitch. As a result, the exposed region of the resist layer 32 is photosensitized in a predetermined depth to form a photosensitized portion 32a. It should be noted that the UV light is absorbed by the UV-absorbing substance or the coloring material contained in the resist layer 32. Therefore, the UV light fails to be transmitted deep inside the resist layer 32 and, thus, the lower portion of the resist layer 32 is not exposed to the UV light. If development is performed under this condition, the non-exposed portion in the surface region of the resist layer 32 is removed, though the photosensitized portion 32 is left unremoved (FIG. 8B). Since all the lower portion of the resist layer 32 is not exposed to the UV light, the development further proceeds sideward to form a tapered flare (FIG. 8C). If the developing conditions are selected appropriately, it is possible to form the partition wall 13 having a flare longer than the eaves (FIG. 8D).

Incidentally, since the positive photoresist is dissolved in its light-exposed portion, it is impossible to apply the above-noted processing applied to the negative photoresist to a positive photoresist.

If post-baking is applied in the present invention after substantially the entire surface of the partition wall 13 is irradiated with an electron beam or a UV light, it is possible to eliminate substantially completely deformation of the partition wall in the post-baking step.

The UV-absorbing substance mixed in the negative photoresist includes, for example, organic UV-absorbing substances conventionally used as ordinary UV-absorbing substances such as benzophenones, phenyl salicylic acids, cyano acrylates, benzotriazoles, oxalic anilides, and triazines and/or inorganic UV-absorbing substances that are used as an ordinary UV-absorbing substance such as glass powder, cerium oxide, carbon, titanium oxide, zinc oxide and iron oxide, as well as a combination thereof. On the other hand, it is desirable to use as a coloring material a black pigment or a mixed pigment of red, green and blue in order to permit the partition wall to perform also the function of a black stripe. However, if it is simply intended to form the partition wall, a single color pigment can be used. It is also possible to use a plurality of coloring materials. Further, a single or a plurality of coloring materials can be used in combination with the UV-absorbing substance.

After formation of the partition wall 13 as described above, an organic EL medium layer 21 and a second electrode line 22 are formed successively by a vapor phase deposition method such as an evaporation deposition method, as shown in FIGS. 6A and 6B. The organic EL medium layer 21 and the second electrode line 22 are formed on the top surface of each of the partition walls 13 and are deposited on the support 11 in a manner to be separated by the eaves of the partition wall 13 so as to be patterned automatically. The most portion of the second electrode line 22/EL medium layer 21 is formed directly on the first electrode line 12. However, the edge portion of each of the second electrode lines 22 extends over the flare in a lower portion of the partition wall 13 so as to be positioned apart from the first electrode line 12. This is because the flare is moderately tapered such that its edge angle is not larger than 45°. As a result, it is possible to suppress the insulation breakdown. It should also be noted that, if the flare is longer than the eaves of the partition wall, the organic EL medium layer 21 and the second electrode line 22 can be formed by vertical vapor deposition.

The second electrode line 22 can be made to extend over the edge of the organic EL medium layer 21 to permit the organic EL medium layer 21 to be covered completely with the second electrode line 22 by controlling appropriately the conditions for forming the second electrode line 22. The particular construction makes it possible to prevent the interface at the cathode electrode/the organic EL medium layer 21 from being exposed to the outside and, thus, from being deteriorated (see FIGS. 6A and 6B).

In the present invention, the organic EL medium layer 21 can be formed as a phosphor-containing single layer film or multi-layered film, as is known in the art.

It is possible for the organic EL medium layer 21 to be of a two-layer structure consisting of a combination of a hole injection-transfer layer and an electron transferring light-emitting layer or another combination of an electron transferring light-emitting layer and an electron transferring layer. It is also possible for the organic EL medium layer 21 to be of a three-layer structure consisting of a hole injection-transfer layer, a light-emitting layer, and an electron transferring layer. The organic EL medium layer 21 may further comprise additional layers. In this case, the layers constituting the organic EL medium layer 21 are formed successively on the substrate.

The hole injection-transfer material can be selected from metal phthalocyanines including copper phthalocyanine and tetra(t-butyl) copper phthalocyanine, metal-free phthalocyanines, quinacridone compounds, aromatic amine series hole injection-transfer materials having a low molecular weight such as 1,1-bis(4-di-p-tolylamino phenyl) cyclohexane, N,N'-diphenyl-N,N'-bis(3-methylphenyl)-1,1'-biphenyl-4,4'-diamine, and N,N'-di(1-naphtyl)-N,N'-diphenyl-1,1'-biphenyl-4,4'-diamine, hole transfer materials having a high molecular weight such as polyaniline, polythiophene oligomer material, and other known hole transfer materials.

The light-emitting material includes, for example, 9,10-diaryl anthracene, pyrene, coronene, perylene, rublene, 1,1,4,4-tetraphenyl butadiene, tris(8-quinolato)aluminum complex, tris(4-methyl-8-quinolato)aluminum complex, bis(8-quinolato)zinc complex, tris(4-methyl-5-trifluoromethyl-8-quinolato)aluminum complex, bis(2-methyl-5-trifluoromethyl-8-quinolato[4-(4-cyanophenyl)phenolate] aluminum complex, bis(2-methyl-5-cyano-8-quinolinolato) [4-(4-cyanophenyl)phenolate]aluminum complex, tris(8-quinolinolato)scandium complex, bis[8-(p-tolyl) aminoquinoline]zinc complex and cadmium complex, 1,2,3,4-tetraphenyl cyclopentadiene, pentaphenyl cyclopentadiene, poly-2,5-diheptyloxy-p-phenylene vinylene, cumarin phosphor, perylene phosphor, pyran phosphor, anthrone phosphor, polyphyrene phosphor, quinacridone phosphor, N,N'-dialkyl-substituted quinacridone phosphor, naphthalimide phosphor, and N,N'-diaryl-substituted pyrrolopyrrole phosphor. These light-emitting materials can be used singly or in combination with another low molecular weight material or high molecular weight material.

The electron-transferring material includes, for example, 2-(4-biphenylyl)-5-(4-t-butylphenyl)-1,3,4-oxadiazole, 2,5-bis(1-naphthyl)-1,3,4-oxadiazole, an oxadiazole derivative synthesized by Hamada et al. (Japan Chemical Institute Magazine, page 1540, 1991), bis(10-hydroxybenzo[h] quinolinolato) beryllium complex, and triazole compounds disclosed in Japanese Patent Disclosure (Kokai) No. 7-90360.

The organic EL medium layer 21 can be formed by a vacuum evaporation deposition method. The thickness of the layer 21 should preferably be 1 $\mu$m or less, more preferably 50 to 150 nm, in each of the cases where the layer 21 is of a single layer structure and of a multi-layered structure.

It is desirable to use a material having a high electron injection efficiency for forming the cathode electrode line. Specifically, there can be used an elemental metal such as magnesium, aluminum or ytterbium. The electrode line can also be formed by forming a layer of lithium, lithium oxide or lithium fluoride in a thickness of about 1 nm in direct contact with the organic EL medium layer, followed by laminating an aluminum or copper layer having a high stability and a high electrical conductivity on the lithium layer or the like.

Alternatively, to meet both the electron injection efficiency and the stability, the second electrode line can be formed by using an alloy containing at least one of metals having a low work function such as Li, Mg, Ca, Sr, La, Ce, Er, Eu, Sc, Y, and Yb, and at least one of stable metals such as Ag, Al, and Cu. For example, a Mg—Ag alloy, an Al—Li alloy or a Cu—Li alloy can be used for forming the second electrode.

The cathode electrode line can be formed by means of a resistance heating vapor deposition method, an electron beam vapor deposition method, a reactive vapor deposition method, an ion plating method or a sputtering method depending on the cathode electrode material used. The thickness of the cathode electrode should desirably be about 10 nm to 1 $\mu$m.

Finally, a sealing layer 23 is formed in general as shown in FIGS. 7A and 7B. The sealing layer 23 serves to prevent the cathode electrode line and the organic EL medium layer 21 from being deteriorated by water and oxygen.

Incidentally, a color display can be obtained, if color filter layers of red (R), green (G) and blue (B) are formed below the transparent electrode in the case of using an organic EL medium emitting white light. Also, a full color display can be achieved, if red and green fluorescent light-converting films are formed in a lower portion of the transparent electrode in the case of using a blue organic EL medium. In this case, the presence of a plurality of partition walls makes it possible for the EL medium of each color to be completely separated and laminated one upon the other by using a mask vapor deposition method. Also, the mask and the organic EL medium layer are held apart from each other, and the EL medium is not diffused.

Needless to say, the substrate for an organic EL display element and the organic EL display element using the particular substrate can be manufactured by the method described above even in the case where the first and second electrodes constitute the cathode and the anode, respectively.

A preferred method of manufacturing a substrate for an organic EL display element of the present invention shown in FIG. 1 will now be described with reference to FIGS. 9A to 12B.

Figure 9A:
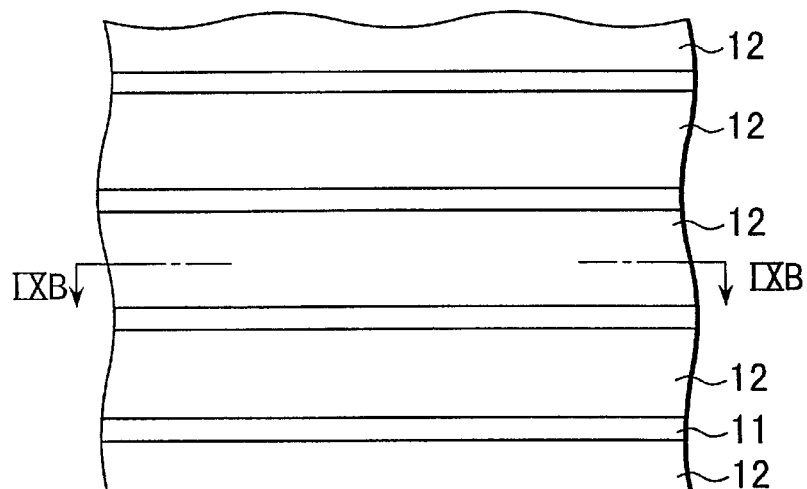
FIG. 9A is a top view which schematically shows a preferred method of manufacturing a substrate for an organic EL display element of the present invention.
Figure 9B:
FIG. 9B is a cross-sectional view along line IX—IX shown in FIG. 9A, in which FIG. 9B schematically shows a preferred method of manufacturing a substrate for an organic EL display element of the present invention.
Figure 10A:
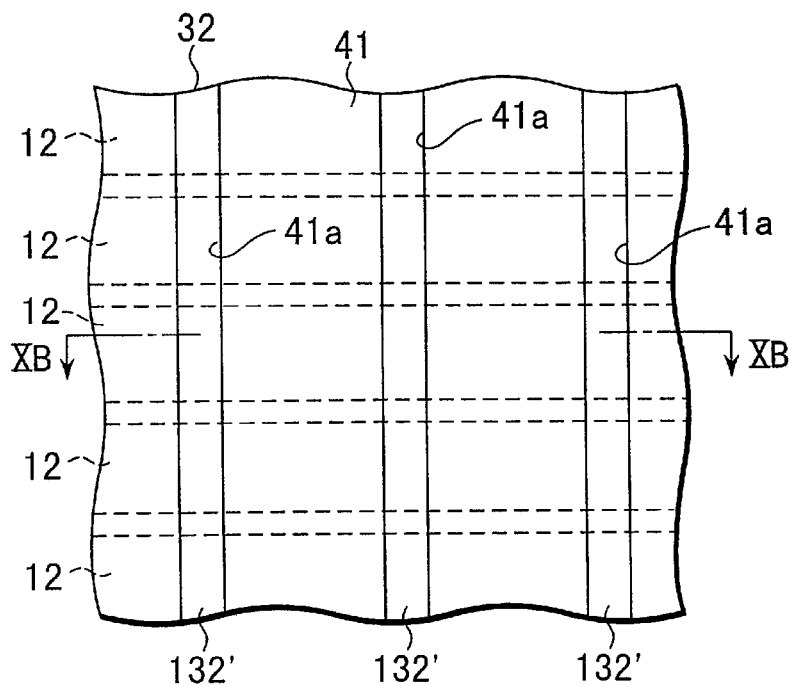
FIG. 10A is a top view which schematically shows a preferred method of manufacturing a substrate for an organic EL display element of the present invention.
Figure 10B:
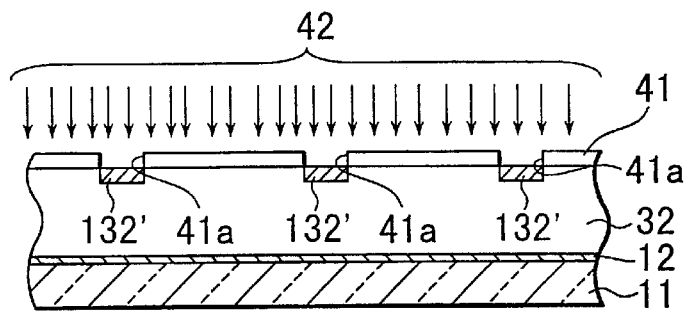
FIG. 10B is a cross-sectional view along line XB—XB shown in FIG. 10A, in which FIG. 10B schematically shows a preferred method of manufacturing a substrate for an organic EL display element of the present invention.

In the first step, a plurality of stripe first electrode lines 12 (anode lines in this embodiment) are formed on the support 11 as shown in FIGS. 9A and 9B by the method described previously in conjunction with FIGS. 5A and 5B. Then, the entire upper surface of the first electrode lines 12 formed on the support 11 is coated with a negative photoresist layer 32 as shown in FIGS. 10A and 10B, said photoresist layer 32 containing a UV-absorbing substance or a coloring matter described previously in conjunction with FIGS. 8A and 8B.

After the coating the negative photoresist layer 32 is pre-baked and, then, a photo mask 41 having a plurality of light-transmitting portions 41a shaped to conform with the shapes of the top surfaces of partition walls each having eaves is disposed on the upper surface of the pre-baked negative photoresist layer 32. Under this condition, the negative photoresist layer 32 is irradiated with a UV light 42. As a result, upper surface regions 132' of the layer 32 corresponding to the top portions 132 (see FIG. 3) of the partition walls each having eaves are exposed to the UV light. Therefore, the upper surface region 132' having a predetermined depth from surface of the photoresist layer 32 is sensitized by the UV light 42. However, the UV light 42 is absorbed by the UV-absorbing substance or the coloring matter contained in the photoresist layer 32, failing to reach a region below the upper surface region 132'. Naturally, the region below the upper surface region 132' is not exposed to the UV light. The light exposure in this step utilizes the UV light emitted from above the support 11 and, thus, is called herein a front surface light exposure.

Then, the photo mask 41 is removed.

Figure 11A:
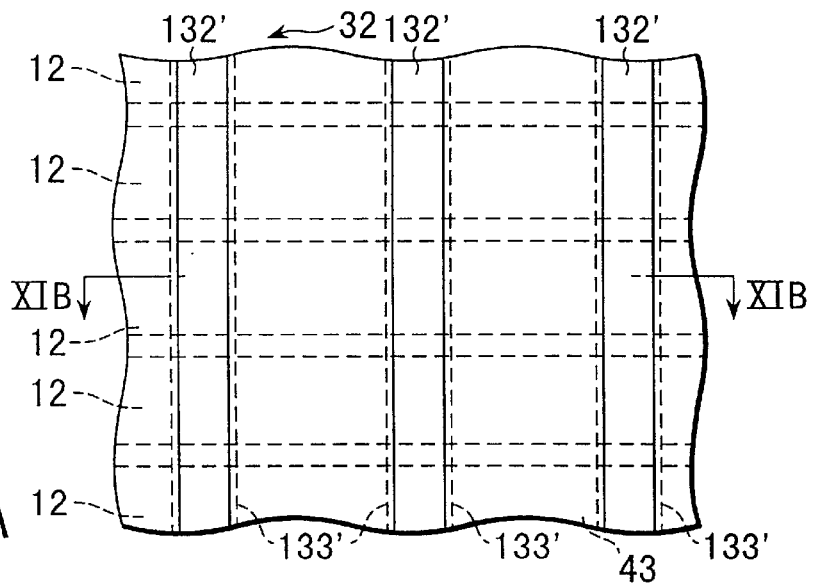
FIG. 11A is a top view which schematically shows a preferred method of manufacturing a substrate for an organic EL display element of the present invention.
Figure 11B:
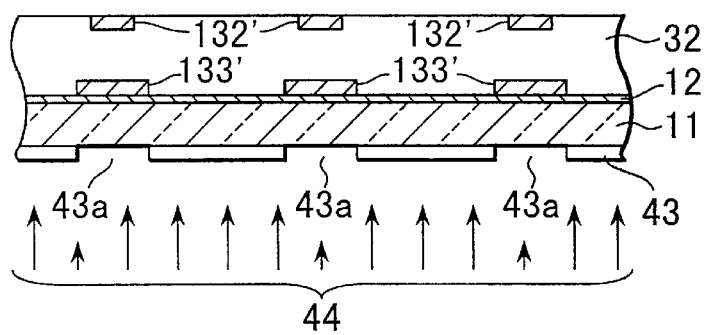
FIG. 11B is a cross-sectional view along line XIB—XIB shown in FIG. 11A, in which FIG. 11B schematically shows a preferred method of manufacturing a substrate for an organic EL display element of the present invention.

After the front surface light exposure is carried out as described above, a photo mask 43 having a plurality of light transmitting portions 43a shaped to conform with the shapes of the bottom portions of the partition walls is disposed on the back surface of the support 11, as shown in FIGS. 11A and 11B. Then, bottom surface regions 133' shaped to conform with the bottom portions of the partition walls (see the bottom portion 133 shown in FIG. 2) are exposed to an UV light 44 emitted from below the support 11. As described previously, the UV light passes through the light transmitting support 11 and the transparent first electrode line 12 to reach the bottom surface region 133' having a predetermined depth from the back surface of the photoresist layer 32 so as to sensitize the bottom surface region 133'. However, since the UV light is absorbed by the UV-absorbing substance or the coloring matter contained in the photoresist layer 32, the UV light 44 fails to reach a region above the bottom surface region 133'. Naturally, the region above the bottom surface region 133' is not exposed to the UV light. The light exposure in this step utilizes the UV light 44 emitted from below the support 11 and, thus, is called herein a back surface light exposure.

Then, the photo mask 43 is removed.

Figure 12A:
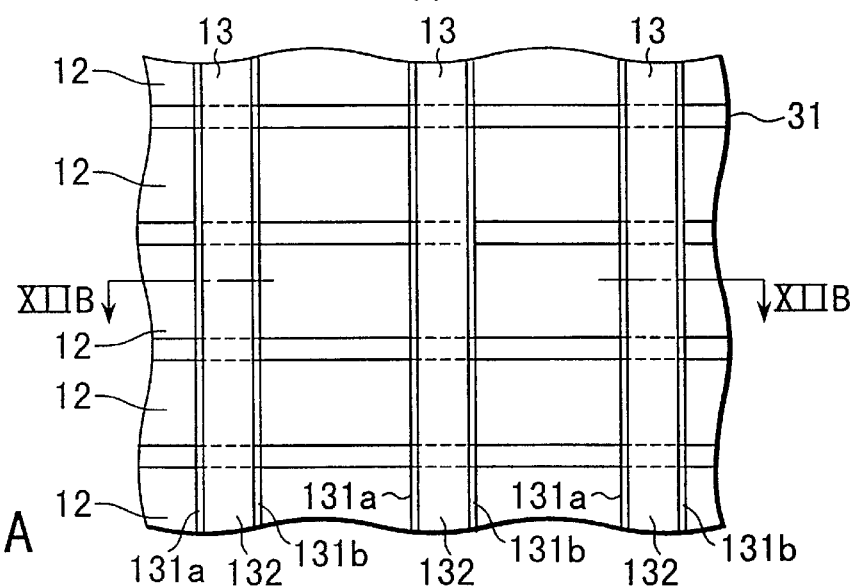
FIG. 12A is a top view which schematically shows a preferred method of manufacturing a substrate for an organic EL display element of the present invention.
Figure 12B:
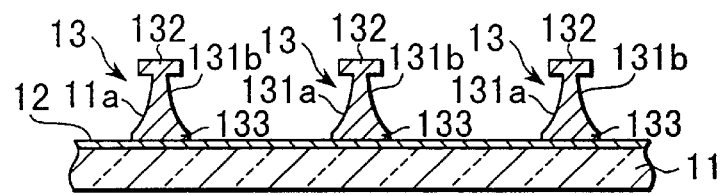
FIG. 12B is a cross-sectional view along line XIIB—XIIB shown in FIG. 12A, in which FIG. 12B schematically shows a preferred method of manufacturing a substrate for an organic EL display element of the present invention.

In the next step, the photoresist layer 32 having the upper surface regions 132' and the bottom surface regions 133' exposed to the UV light is developed using a developing solution. In this developing treatment, the non-exposed portion of the photoresist layer 32 is dissolved in the developing solution so as to be removed. The removal starts from the upper surface of the non-exposed portion and proceeds also sideward into a region below the upper surface region 132' so as to form the tapered side surfaces 131a, 131b (see FIG. 1, too) moderately curved to reach both edges on the upper surface of the bottom surface region 133', thereby forming a plurality of partition walls 13 each having eaves in the upper portion and a flare in the lower portion as shown in FIGS. 2 and 3. FIGS. 12A and 12B show that the partition walls 13 are positioned apart from each other and extend in a direction perpendicular to the first electrode lines 12.

Finally, post-baking is performed by means of irradiation with an electron beam or a UV light so as to finish preparation of the substrate for an organic EL display element. Incidentally, the front surface light exposure (first light exposure) and the back surface light exposure (second light exposure) may be performed in the reverse order, or simultaneously.

By applying the light exposure to the region corresponding to the bottom portion of the partition wall in addition to the light exposure to the region corresponding to the top portion of the partition wall, it is possible to define accurately the width of the flare of the partition wall, too. As a result, it is possible to manufacture an organic EL display element smaller in nonuniformity in the size of pixels.

Figure 13:
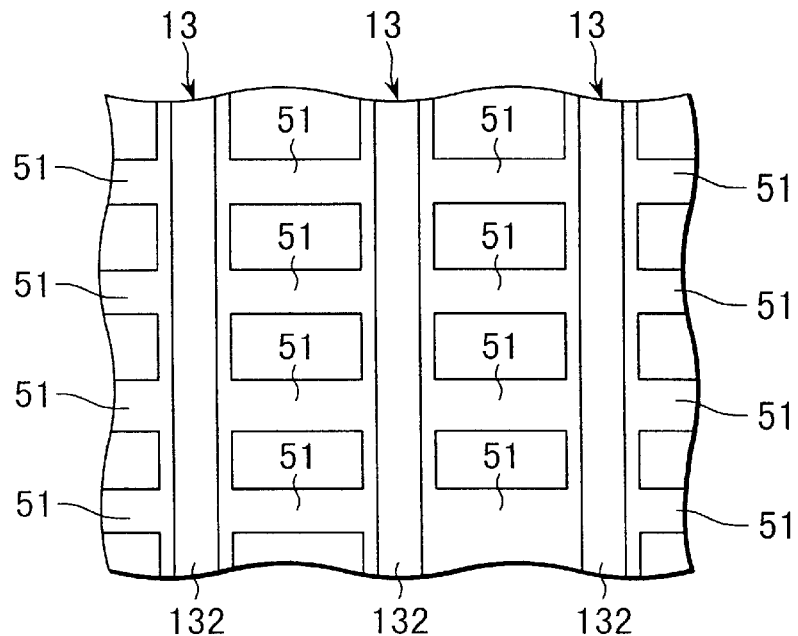
FIG. 13 is a top view showing a substrate for an organic EL display element of the present invention equipped with partition walls joined by joining bands.

FIG. 13, which is directed to a preferred embodiment of a first aspect of the present invention, shows a plurality of the partition walls 13 as viewed from above. In this embodiment, a plurality of connection bands 51 are interposed between adjacent partition walls 13. Each connection band 51 serves to connect the adjacent partition walls 13 to each other at the lower portions. As shown in FIG. 13, a plurality of the partition walls 13 constructed as shown in FIGS. 2 and 3 are arranged a predetermined distance apart from each other. It should be noted that adjacent partition walls 13 are connected to each other by a plurality of the connection bands 51 at the lower end portions, i.e., at the bottom portions 133 shown in FIG. 2. As described herein later, the connection bands 51 should desirably be arranged to fill the clearance between adjacent first electrode lines (not shown) and to cover the edge portions facing each other of the adjacent first electrode lines.

These connection bands 51 permit effectively preventing the short-circuiting at the side edge portion of the first electrode line between the first and second electrode lines. To be more specific, the flared side surface of the partition wall permits preventing the short-circuiting at the side edge of the second electrode between the second electrode line and the first electrode line. However, where the film thickness is increased for lowering the electrical resistance of the first electrode line, it is possible for the organic EL medium layer to be broken at the stepped edge portion of the thick first electrode line. Also, short-circuiting tends to take place at the stepped edge portion of the thick first electrode between the first and second electrode lines. The connection band 51 serves to prevent effectively the breakage or the short-circuiting at the stepped portion.

FIGS. 14A to 15B collectively show how to manufacture a substrate for an organic EL display element constructed as shown in FIG. 13.

In the first step, the first electrode lines 12 are formed on the support 11 as described previously in conjunction with FIGS. 4A and 4B, followed by forming the negative photoresist layer 32 containing a UV-absorbing substance and subsequently applying the front surface light exposure to the photoresist layer 32. Then, the back surface light exposure is applied by using a photo mask differing from that described previously in conjunction with FIGS. 11A and 11B.

Figure 14A:
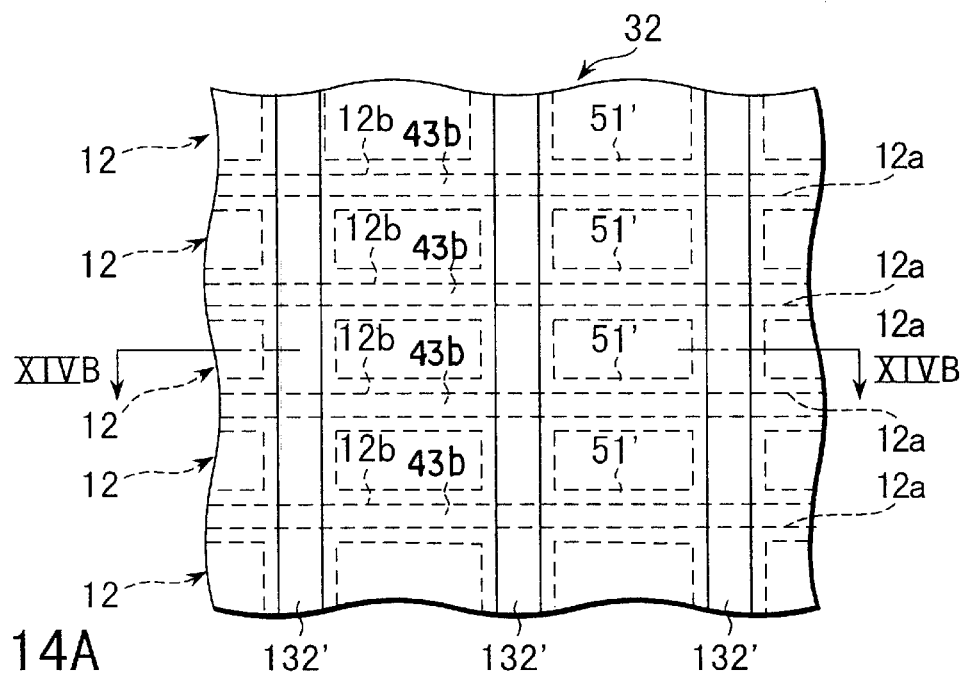
FIG. 14A is a top view which schematically shows a method of manufacturing a substrate for an organic EL display element of the present invention equipped with a partition wall joined by bands.
Figure 14B:
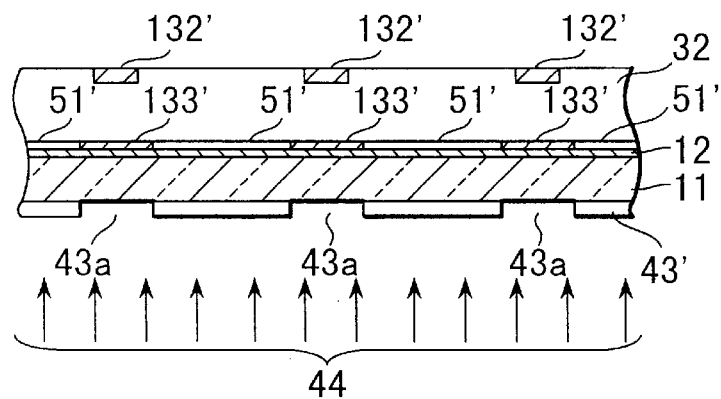
FIG. 14B is a cross-section view along line XIVB—XIVB shown in FIG. 14A, in which FIG. 14B schematically shows a method of manufacturing a substrate for an organic EL display element of the present invention equipped with a partition wall joined by bands.

To be more specific, a photo mask 43' shown in FIGS. 14A and 14B is used in this embodiment. The photo mask 43' is provided with a plurality of first light transmitting windows 43a shaped to conform with the shape of the bottom portions 133 of the partition walls and with a plurality of second light transmitting windows 43b shaped to conform with the shape of the connection bands 51 (see FIG. 13). The second windows 43b should desirably be arranged to permit the clearance between adjacent first electrode lines 12 and side edge portions 12a, 12b, which face each other, of adjacent first electrode lines 12 to be exposed to light.

The back surface light exposure is performed as described previously in conjunction with FIGS. 11A and 11B by using the photo mask 43' so as to expose regions 133, which correspond to the bottom portions of the partition walls, of the photoresist film 32 and regions 51' corresponding to the connection bands.

Figure 15A:
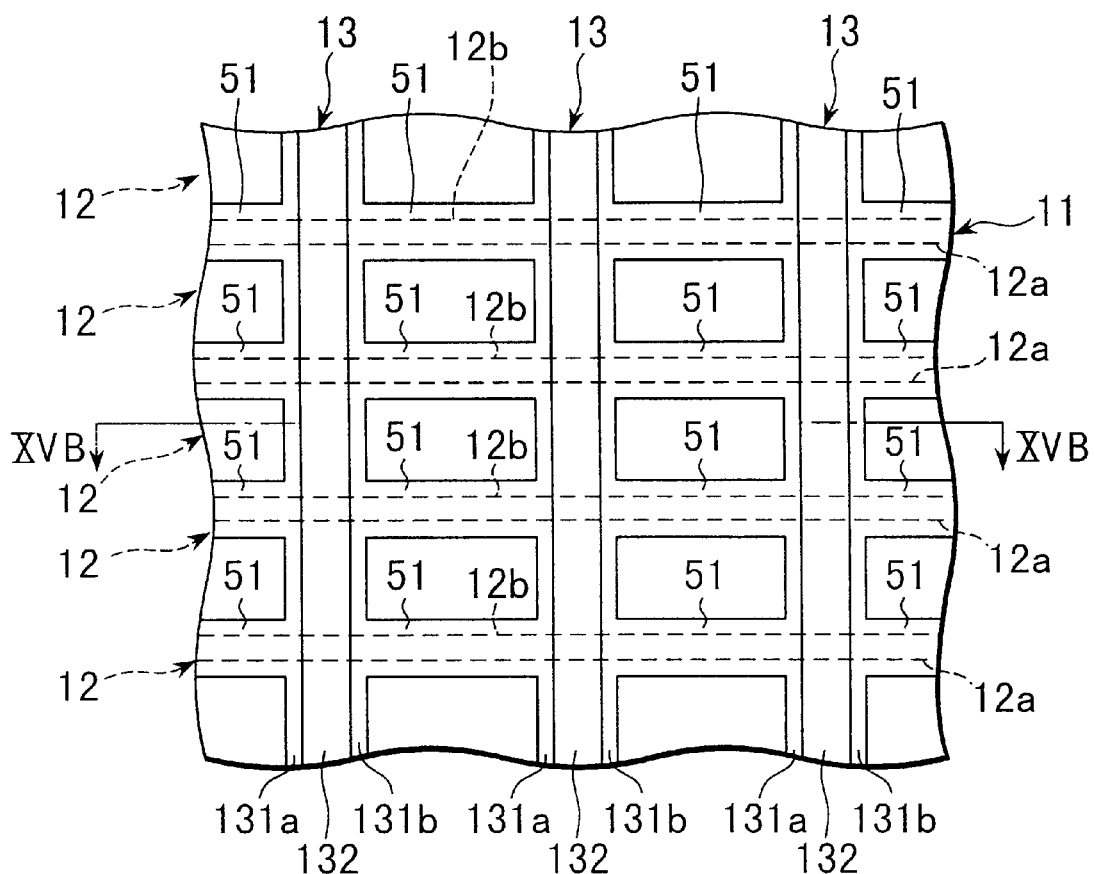
FIG. 15A is a top view which schematically shows a method of manufacturing a substrate for an organic EL display element of the present invention equipped with a partition wall joined by bands.
Figure 15B:
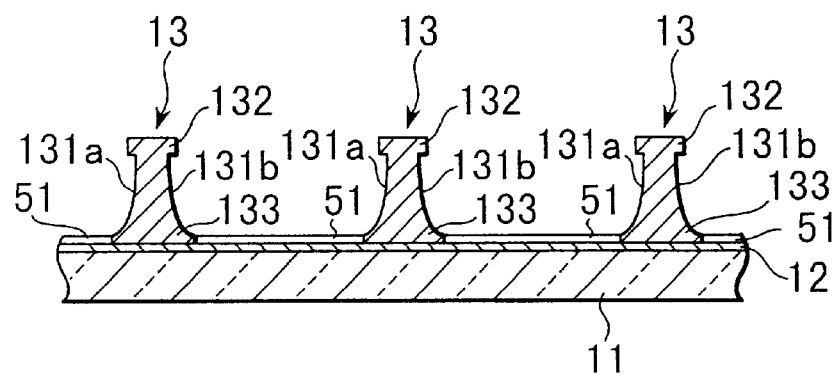
FIG. 15B is a cross-sectional view along line XVB—XVB shown in FIG. 15A, in which FIG. 15A schematically shows a method of manufacturing a substrate for an organic EL display element of the present invention equipped with a partition wall joined by bands.

Then, the photoresist layer 32 is developed as described previously so as to obtain a plurality of partition walls 13 as shown in FIGS. 15A and 15B. Each partition wall 13 has eaves in an upper portion and a flare in a lower portion. Also, these partition walls 13 are shaped such that the lower flare portions of the adjacent partition walls 13 are connected to each other by a plurality of connection bands 51. As described previously, it is desirable to form each connection band 51 to cover the side edges 12a, 12b facing each other of adjacent first electrode lines. In this case, it is possible to prevent completely the short-circuiting between the second electrode line that is to be formed later and the first electrode line 12 at the side edges 12a, 12b of the adjacent first electrode lines 12.

Finally, post-baking is applied after irradiation with an electron beam or a UV light so as to finish preparation of a substrate for an organic EL display element.

FIGS. 16A to 17B collectively show another method of manufacturing a substrate for an organic EL display element constructed as shown in FIG. 13. In this embodiment, color filters are formed in advance on the support 11 and these color filters are used as a photo mask in performing the back surface light exposure.

Figure 16A:
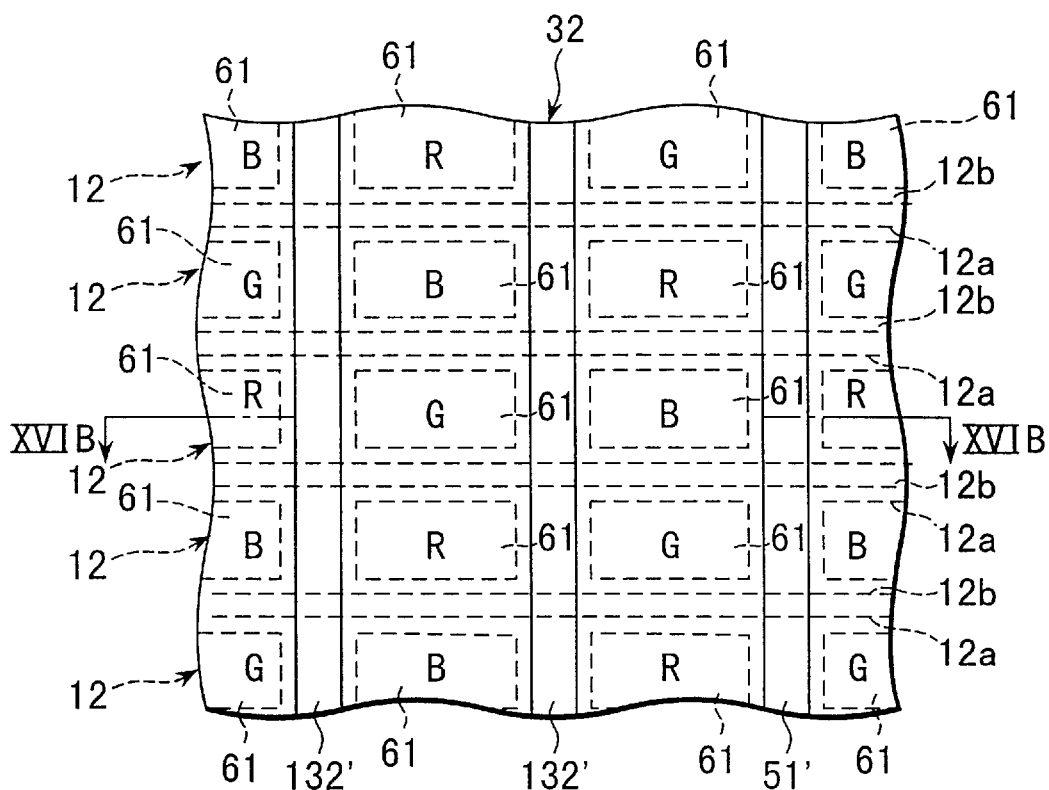
FIG. 16A is a top view which schematically shows another method of manufacturing a substrate for an organic EL display element of the present invention equipped with a partition wall joined by bands.
Figure 16B:
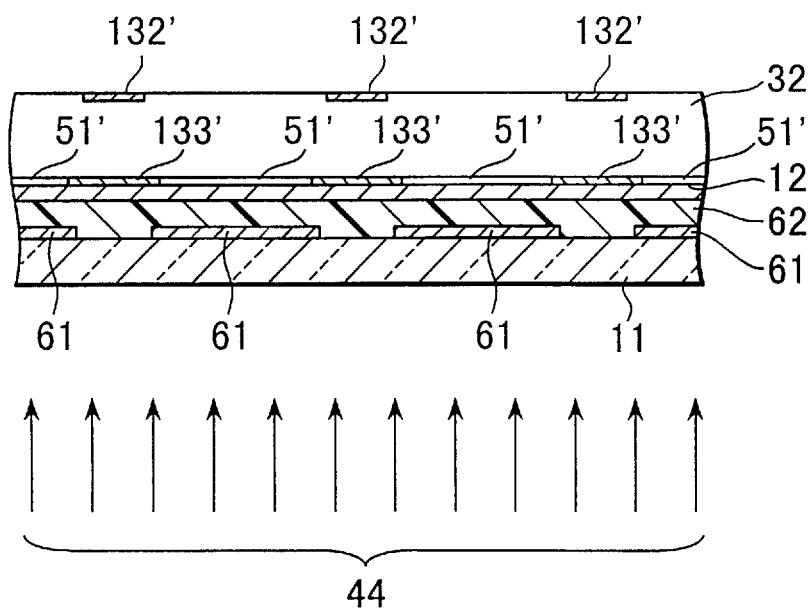
FIG. 16B is a cross-sectional view along line XVIB—XVIB shown in FIG. 16A, in which FIG. 16B schematically shows another method of manufacturing a substrate for an organic EL display element of the present invention equipped with a partition wall joined by bands.

In the first step, substantially rectangular color filters 61 having three colors of R, G, B are formed by the ordinary method on the support 11, as shown in FIGS. 16A and 16B. These color filters 61 are arranged to form rows and columns of the color filters such that a lattice-shaped clearance is formed therebetween. Then, an over-coat layer 62 is formed on the entire front surface of the support 11 to cover the color filters 61. As widely known in this technical field, the over-coat layer 62, which is intended to flatten the surface and to protect the color filters 61, can be formed with a transparent resin. The first electrode lines 12 are formed on the over-coat layer 62. Needless to say, each of the first electrode lines 12 is arranged to cover a plurality of color filters 61 forming a single row, and has a width larger than the width of the row of the color filters, as shown in FIG. 16A. It follows that the clearance between adjacent first electrode lines 12 is smaller than the clearance between adjacent rows of the color filters.

In the next step, the negative photoresist layer 32 containing a UV-absorbing substance or a coloring matter is formed, followed by the front surface light exposure to expose regions 132' corresponding to the top portions of the partition walls to light. Then, the back surface light exposure is performed to expose regions 133' corresponding to the bottom portions of the partition walls to a UV light without using a newly-formed photo mask. In this step, the color filters 61 are used as a photo mask. It should be noted that the UV light passes through the lattice-shaped clearance between adjacent color filters 61. It follows that not only the regions 133' corresponding to the bottom portions of the partition walls but also regions 51' corresponding to the connection bands are exposed to the UV light, said regions 133' and 51' being included in the photoresist layer 32.

Figure 17A:
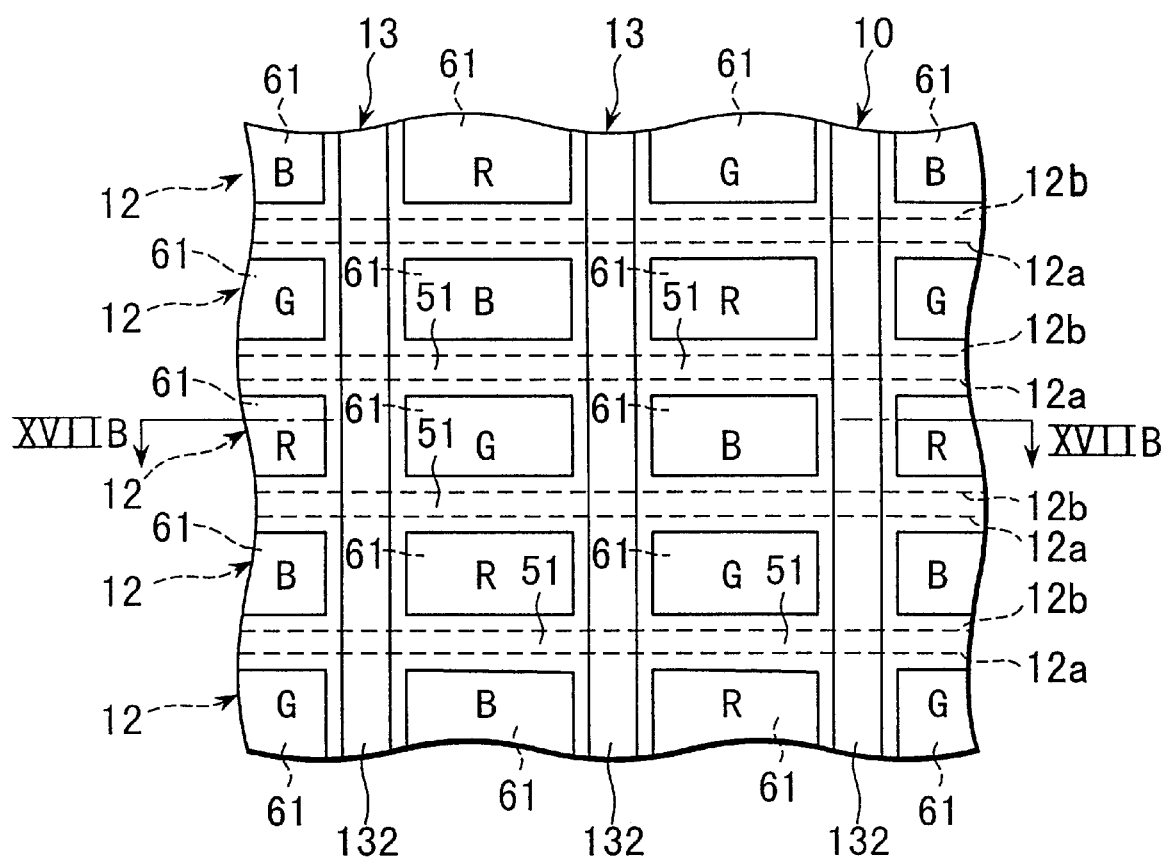
FIG. 17A is a top view which schematically shows another method of manufacturing a substrate for an organic EL display element of the present invention equipped with a partition wall joined by bands.
Figure 17B:
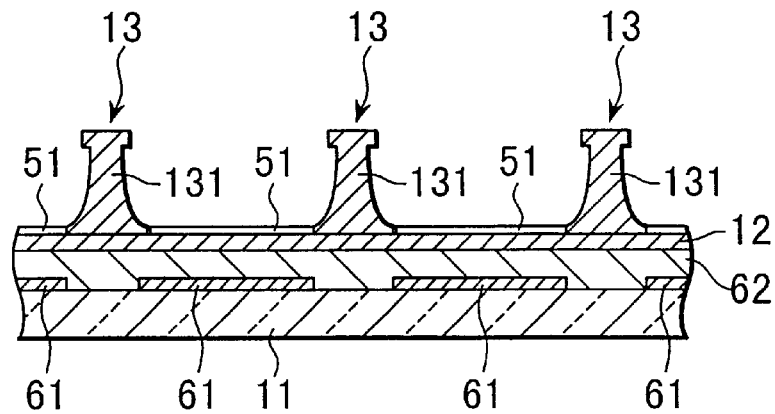
FIG. 17B is a cross-sectional view along line XVIIB—XVIIB shown in FIG. 17A, in which FIG. 17B schematically shows another method of manufacturing a substrate for an organic EL display element of the present invention equipped with a partition wall joined by bands.

Then, the partition walls 13 are formed as shown in FIGS. 17A and 17B by developing the photoresist layer 32.

Finally, irradiation with an electron beam or a UV light and post-baking are performed to finish preparation of the substrate for an organic EL display element. Incidentally, the first light exposure and the back surface light exposure may be performed in the reverse order or simultaneously.

Figure 18A:
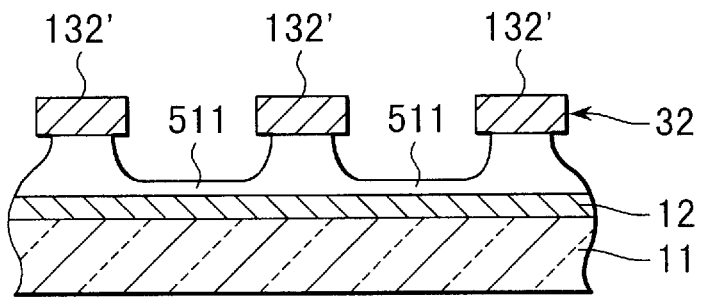
FIGS. 18A to 18C are cross sectional views schematically showing another method of manufacturing a substrate for an organic EL display element of the present invention equipped with a partition wall joined by joining bands.
Figure 18B:
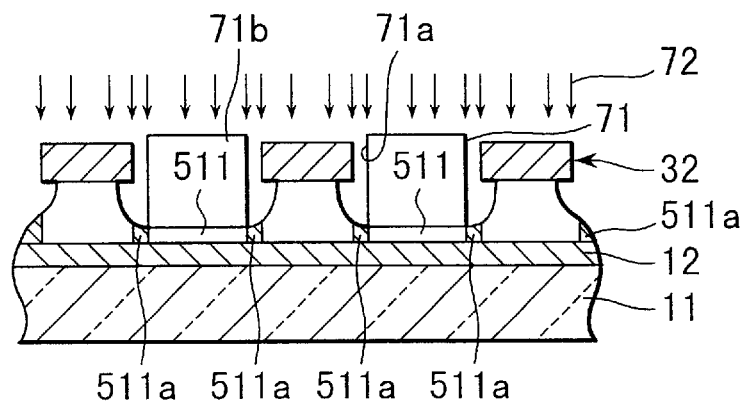
Figure 18C:
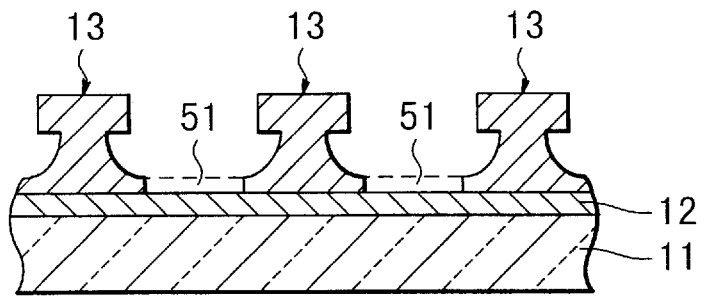

FIGS. 18A to 18C are cross sectional views schematically showing a still another method of manufacturing a substrate for an organic EL display element constructed as shown in FIG. 1 or 13. In this embodiment, the front surface light exposure is carried out twice.

In the first step, the first electrode lines 12 are formed on the support 11, as shown in FIG. 18A, followed by forming the negative photoresist layer 32 containing a UV-absorbing substance or a coloring matter and subsequently performing the front surface light exposure to expose the regions 132' corresponding to the top portions of the partition walls to a UV light. Then, the photoresist layer 32 is partially developed with a developing solution. To be more specific, the photoresist layer 32 is developed to permit the flares of the partition walls to project from the tips of the eaves as viewed from above and is stopped to prevent those portions of the photoresist layer 32 which are positioned between adjacent regions corresponding to the partition walls from being removed completely. In other words, the photoresist layer 32 is developed to permit continuous thin film portions 511 to be left unremoved between adjacent partition wall regions.

Then, a photo mask 71 is disposed from the upper side of the structure shown in FIG. 18A, as shown in FIG. 18B. The photo mask 71 includes slit-like light transmitting portions 71a each having a width equal to the width of the bottom portion 133 (see FIG. 2) of each of the partition walls and opaque portions 71b positioned above the continuous thin film portions 511. Preferably, the photo mask 71 should also include light transmitting portions (not shown) corresponding to the connection bands 51 (see FIG. 13). In this case, the thickness in the central portion of the continuous thin film portion 511 determines the thickness of the connection band 51. If the front surface light exposure is performed by using the photo mask 71 and the UV light 72 emitted from above the support, the regions 132' corresponding to the top portions of the partition walls also act as a mask. As a result, regions 511a of the continuous thin film portions 511, said regions 511a corresponding to the tip portions of the flares of the partition walls, are selectively exposed to the UV light.

Then, the structure shown in FIG. 18B is developed FIG. 18C to form the partition walls 13 constructed as shown in FIG. 1 or 13 (FIG. 18C).

FIGS. 19A to 19D are cross sectional views collectively showing how to manufacture an organic electroluminescence (EL) display element of the present invention.

Figure 19A:
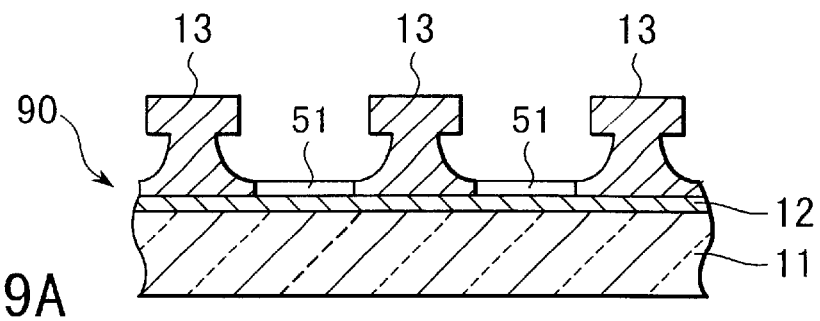
FIGS. 19A to 19D are cross sectional views schematically showing a method of manufacturing an organic EL display element by using a substrate for an organic EL display element of the present invention equipped with a partition wall joined by joining bands.

A substrate 80 for an organic EL display element constructed as shown in FIG. 13 is prepared as shown in FIG. 19A.

Figure 19B:
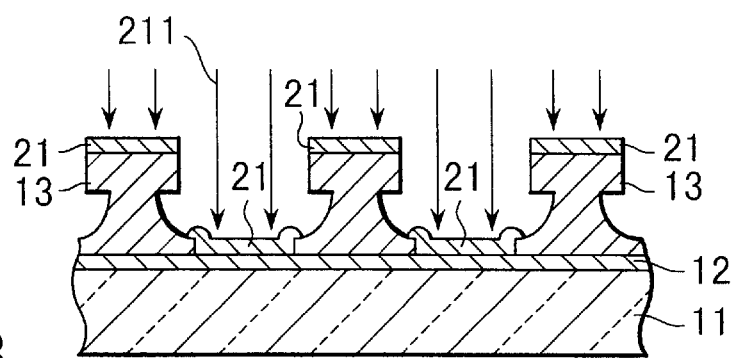

Then, an organic EL medium 21 is formed in at least each of the regions between adjacent partition walls 13, as shown in FIG. 19B. Vapor deposition beams for forming the organic EL medium are denoted by arrows 211 in FIG. 19B. The vapor deposition can be performed while rotating the substrate 80. FIG. 19B shows that the vapor deposition beams 211 run in a direction substantially perpendicular to the support 11. By this vapor deposition, the organic EL medium 21 is formed between adjacent partition walls 13, on the mutually facing flare portions of adjacent partition walls 13, and on the tops of the partition walls 13. In other words, the organic EL medium is patterned by the presence of the partition walls 13 simultaneously with the vapor deposition.

Figure 19C:
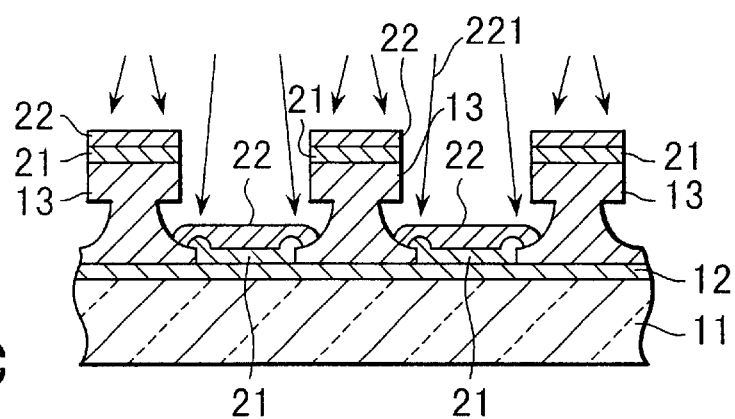

In the next step, the second electrode lines 22 are formed in at least the regions between adjacent partition walls 13, as shown in FIG. 19C. Since the first electrode lines 12 constitute the anode, the second electrode lines 22 naturally constitute the cathode.

It is desirable to form the second electrode lines 22, i.e., cathode, while rotating the substrate 80.

If the beam 221 of the second electrode material is directed toward the entire substrate 80 while rotating the substrate, the second electrode material beam 221 arrives at the substrate 80 in a direction somewhat inclined relative to the substrate 80. As a result, the second electrode line 22 is allowed to cover the organic EL medium 21 positioned between adjacent partition walls 13 and to extend over the flared side wall of each partition wall 13. In addition, the organic EL medium 21 is also formed on the top surface of the partition wall 13. In other words, the presence of the partition walls 13 permits the second electrode lines 22 to be patterned when formed. In this fashion, the second electrode line 22 positioned between adjacent partition walls 13 is completely isolated from the first electrode line 12.

Finally, an ordinary sealing layer 23 is formed in order to prevent the cathode and the organic EL medium from being deteriorated by water or oxygen. If the entire surface of the substrate 80 is irradiated with a sealing material beam 231 while rotating the substrate 80, the sealing layer 23 is also patterned when formed. As a result, the sealing layer 23 is formed to cover the second electrode line 22 positioned between adjacent partition walls 13 and to extend over the flared side wall of the partition wall 13. The sealing layer 23 is also formed to cover the upper surface of the second electrode line 22 positioned on the top surface of the partition wall 13 and to cover the side surfaces of the top portion of the partition wall 13, the organic EL medium 21 and the second electrode line 22 positioned in the top portion of the partition wall 13.

FIGS. 20A to 20I collectively show a method of manufacturing a substrate for an organic EL display element according to a second aspect of the present invention and a display element using the particular substrate.

Figure 20A:
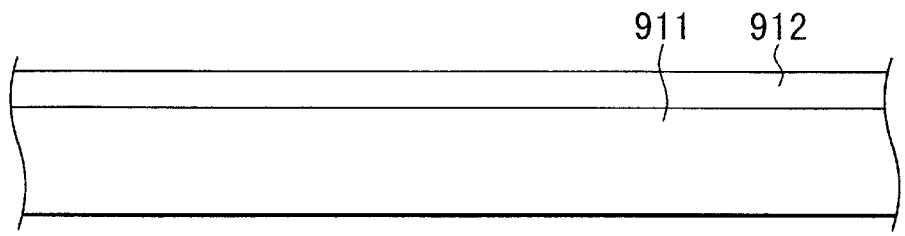
FIGS. 20A to 20I are cross sectional views schematically showing a method of manufacturing a substrate for an organic EL display element of the present invention equipped with a conductive bus line and an organic EL display element.

In the first step, the entire surface of a support 911 similar to the support 11 described previously is coated with a negative photoresist layer 912 containing a UV-absorbing substance or a coloring matter, as shown in FIG. 20A, followed by drying the photoresist layer 912. The negative photoresist layer 912 is similar to the negative photoresist layer 32 described previously.

Figure 20B:
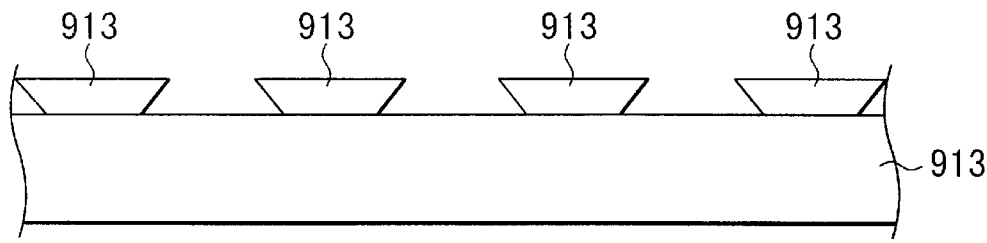

In the next step, a UV light exposure and development are performed by using a photo mask (not shown) having light-transmitting portions formed at a predetermined pitch so as to form a striped electrical insulating layer 913, as shown in FIG. 20B. In the step of the light exposure, a surface region having a predetermined depth from the surface of the photoresist layer 912 is sensitized. However, since the UV light is absorbed by the UV-absorbing substance or coloring matter contained in the photoresist layer 912, the UV light fails to reach a region below the surface region noted above. Therefore, the lower region of the photoresist layer 912 is not exposed to the UV light. If the photoresist layer is developed under this condition, the non-exposed portion is removed, though the exposed portion in the surface region of the photoresist layer 912 is not dissolved in the developing solution so as to remain unremoved. If the conditions for the light exposure and the development are selected appropriately, it is possible to form the electrical insulating layer 913 that is tapered inversely as shown in FIG. 20B.

Figure 20C:
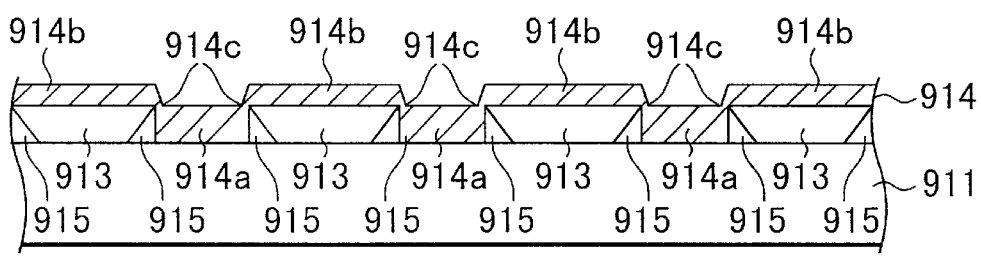

Then, an electrically conductive material layer 914 is formed on the entire surface of the support 911 having the electrically insulating layer 913 formed thereon, as shown in FIG. 20C. For forming the conductive material layer 914, it is desirable to use a metallic material selected from the group consisting of Ni, Cu, Cr, Fe, Co, Au, Ag, Pt, Rh, Pd, Pb, Sn and an alloy containing at least one of these metal elements. The conductive material layer 914 can be formed by, for example, a sputtering method.

As shown in FIG. 20C, the conductive material layer 914 is formed to cover continuously the surface of the support 911 positioned between adjacent electrical insulating layers 913 and the upper surface of the insulating layer 913. Where the insulating layer 913 is inversely tapered, a substantially striped portion 914a is formed between adjacent insulating layers 913, and a clearance 915 is formed between the side surface of the striped portion 914a and the side surface of the insulating layer 91. The striped portion 914a of the conductive material layer 914 is contiguous to a portion 914b positioned on the upper surface of the insulating layer 913 via a thin stepped portion 914c formed therebetween.

Figure 20D:
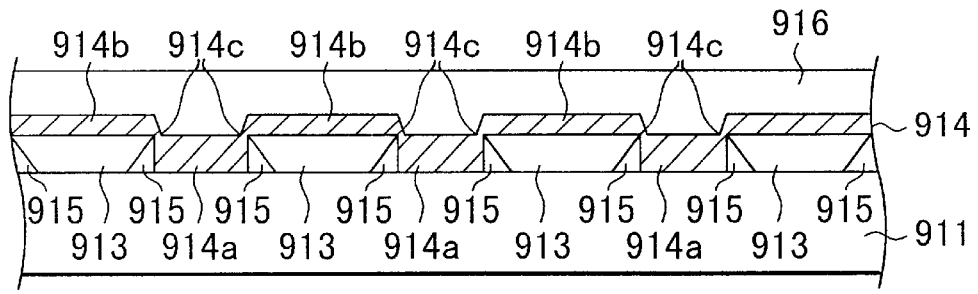

In the next step, a photoresist layer 916 is formed on the conductive material layer 914 as shown in FIG. 20D in order to form a mask for etching the conductive material layer 914.

Then, the photoresist layer 916 is worked to form a predetermined etching mask 917, followed by etching the conductive material layer 914 to form a conductive bus line 918. It should be noted that the conductive bus line 918 is brought into contact with the insulating layer 913 only on one side (see FIG. 20F).

Figure 20E:
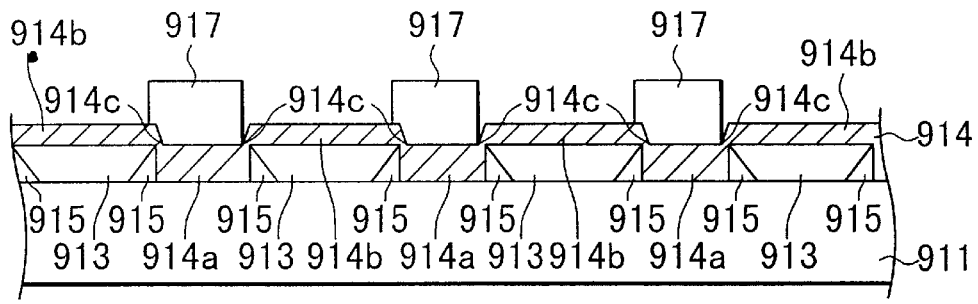
Figure 20F:
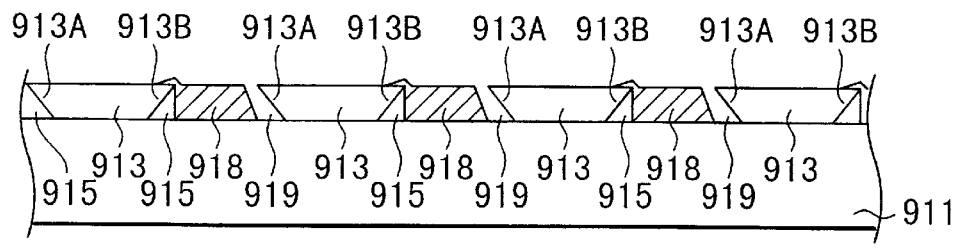

It is one of the preferred embodiments of the present invention to bring the conductive bus line 918 into contact with the electrical insulating layer 913 on only one side. To form the particular structure, the resist pattern 917 positioned on the conductive material layer 914 is shaped to cover at one end portion one of the stepped portions 914c, which face each other, of the conductive material layer and the portion 914b on the insulating layer 913 and to expose at the other end portion the other stepped portion 914c, as shown in FIG. 20E. If the conductive material layer 914 is etched using the particular etching mask, the etching proceeds through the exposed stepped portion 914c, though the stepped portion 914c covered with the etching mask is not etched. As a result, it is possible to form the conductive bus line 918 that is brought in its only one side into contact with the insulating layer 913 (a side edge portion 913B of the insulating layer 913 in FIG. 20F) in the region corresponding to the remaining stepped portion 914c, as shown in FIG. 20F.

The electrical resistance between both edges of the conductive bus line 918 should desirably be as low as possible. Specifically, the resistance should desirably be 1000Ω or less, more desirably 100Ω or less. However, the width of each bus line 918 should desirably be ½ or less of the maximum width of the pixel, more desirably ¼ or less of the maximum width of the pixel, in order to ensure transmittance of the EL light. In addition, it is desirable for each bus line 918 to have a width larger than 1/20 the maximum width of the pixel because it is difficult to lower sufficiently the resistance of the bus line 918 if the width of the bus line 918 is smaller than 1/20 the width of the first electrode line. The height of each bus line 918 should desirably be 0.1 $\mu$m or more in general. Further, it is desirable to form each bus line 918 such that the upper surface of the bus line 918 is substantially flush with the upper surface of the insulating layer 913. Incidentally, the height of each bus line 918 should desirably be 50 $\mu$m or less in order to prevent the radiating direction of the EL light from being restricted to narrow the viewing angle.

For example, where the first electrode line has a width of 100 $\mu$m and a bus line 918 having a length of 7 cm is formed by using a copper-based metal having a resistivity of 2E-6 Ωcm, the resistance between both edges of the bus line 918 is about 10Ω if the bus line 918 has a width of 25 $\mu$m, which is ¼ the pixel width, and a height of 5 $\mu$m. The resistance of 10Ω noted above is less than one part per several millions of the resistance of the first electrode line made of, for example, indium tin compound oxide (ITO) alone. It follows that it is possible to prevent the energy loss caused by the voltage drop across the first electrode line.

It is also desirable to form a light-absorbing metal oxide layer (not shown) in contact with the support 911 of the conductive bus line 918. In this case, the conductive bus line 918 is allowed to perform the function of a black stripe so as to prevent reflection of the external light. As a result, the contrast of the EL display element can be improved.

Figure 20G:
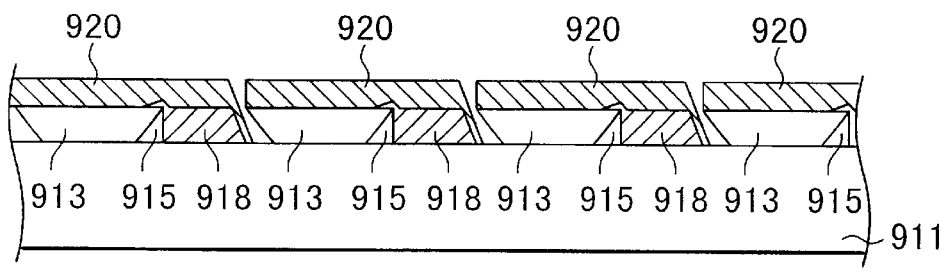

After formation of the bus line 918, a transparent conductive film 920 constituting the first electrode line is formed by, preferably, a sputtering method, as shown in FIG. 20G. It should be noted that the insulating layer 913 is inversely tapered to form eaves in an upper portion such that the side edge portions 913B and 913A are in contact and not in contact, respectively, with the conductive bus line, as apparent from FIG. 20F. In other words, a clearance 919 is formed between the side edge portion 913A and the bus line 918. It follows that the transparent electrode film 920 is automatically patterned when formed (omission of the patterning step). Naturally, corrosion of the conductive bus line 918 with an etching solution need not be worried about.

An electrode material similar to that used for forming the first electrode line 12 described previously can be used for forming the transparent conductive film 920.

Figure 20H:
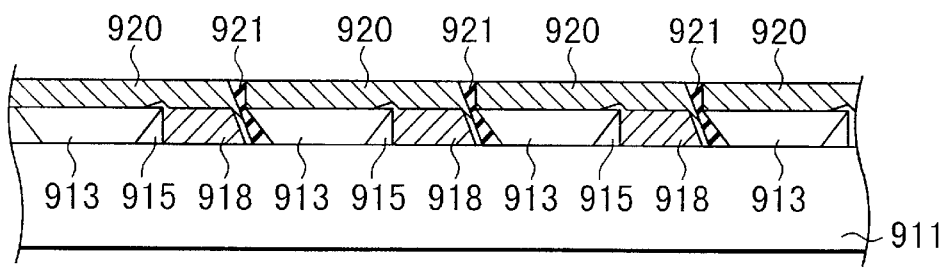

After formation of the transparent conductive film 920, the clearance 919 between the insulating layer 913 and the adjacent conductive bus line is filled with an electrically insulating material 921 such as resin, thereby forming a substrate for an organic El display element according to the second aspect of the present invention (see FIG. 20H).

As apparent from the description given above, the substrate for an organic EL display element of the present invention is constructed such that a plurality of the first electrode lines 920 are arranged apart from each other, and the conductive bus lines 918 extend substantially in parallel to the first electrode lines 920. Also, the first electrode lines 920 are arranged apart from the support 911 (due to the presence of the insulating layers 913). In addition, (only) one end portion of the first electrode line 920 is positioned on the surface of the adjacent conductive bus line 918. What should be noted is that the first electrode line is in contact with a relatively large surface of the conductive bus line 918 formed on the support. As a result, the resistance of the first electrode line 920 is further lowered so as to lower the driving voltage of the organic EL display element. It should also be noted that the first electrode line is patterned when formed, making it possible to omit a patterning step with an etching solution.

Figure 20I:
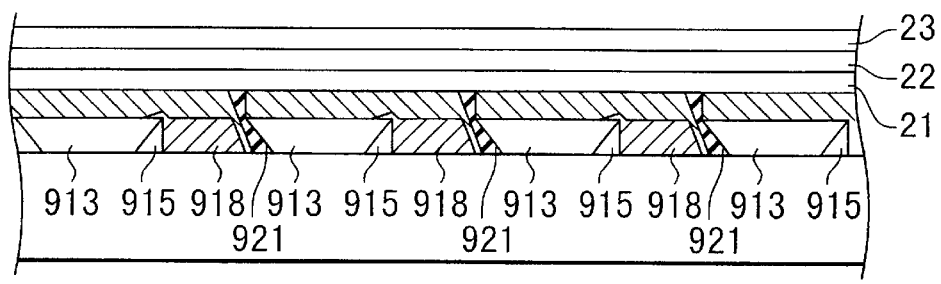

Further, the organic EL medium layer 21 and second electrode lines 22 apart from each other are formed by the ordinary method in a manner to extend in a direction crossing the first electrode lines, as shown in FIG. 20I. The organic EL medium layer 21 and the second electrode lines 22 should desirably extend in a direction perpendicular to the first electrode lines. Finally, the sealing layer 23 is formed by, for example, an ion plating method so as to finish manufacture of the organic EL display element.

In the present invention, it is desirable to form a plurality of partition walls that permit patterning the organic EL medium layer and the second electrode lines when formed. These partition walls should be formed apart from each other on the substrate for the organic EL display element shown in FIG. 20H in a manner to extend in a direction crossing the first electrode lines 920, preferably in a direction perpendicular to the first electrode line 920. Each partition wall should be inversely tapered or should be T-shaped. Preferably, the partition wall should have eaves and a flared side wall as defined in the present invention.

In a preferred embodiment of the present invention, the partition wall has eaves in an upper portion and a flare in a lower portion as shown in FIGS. 2 and 3. More preferably, the partition walls should have a plurality of connection bands serving to connect the flare portions of adjacent partition walls.

Figure 21A:
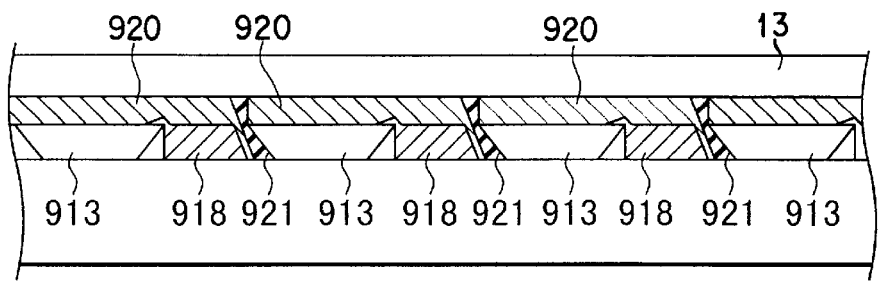
FIGS. 21A and 21B are cross sectional views schematically showing in different directions another substrate for an organic EL display element equipped with a conductive bus line.
Figure 21B:
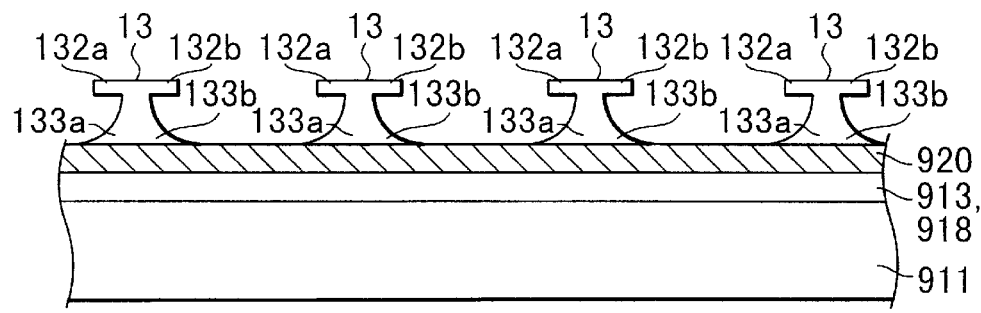

FIGS. 21A and 21B collectively a substrate for an organic EL display element of the present invention having partition walls 13 formed on the substrate shown in FIG. 20H. Specifically, FIG. 21A is a cross sectional view in a direction equal to that of FIGS. 20A to 20I, and FIG. 21B is a cross sectional view in a direction perpendicular to that of FIG. 21A. Each partition wall 13 has eaves 132a, 132 in an upper portion and flares 133a, 133b in a lower portion, and extends in a direction perpendicular to the first electrode line 920.

In forming the particular partition wall, the negative photoresist (see, e.g., resist layer 32 shown in FIG. 8A) itself for forming the partition wall, which is coated on the support, naturally fills the clearance 919 between the insulating layer 913 and the adjacent conductive bus line, making it unnecessary to fill in advance the clearance 919 with the insulating material 921 (see FIG. 20H). In this case, the width of the clearance 919 should desirably be 1 to 500 μm.

Incidentally, the principle for forming the inversely tapered insulating layer 913 is basically equal to the principle for forming the partition wall 13. In the case of the insulating layer 913, the developing conditions are selected to make the flare shorter than the eaves.

Figure 22:
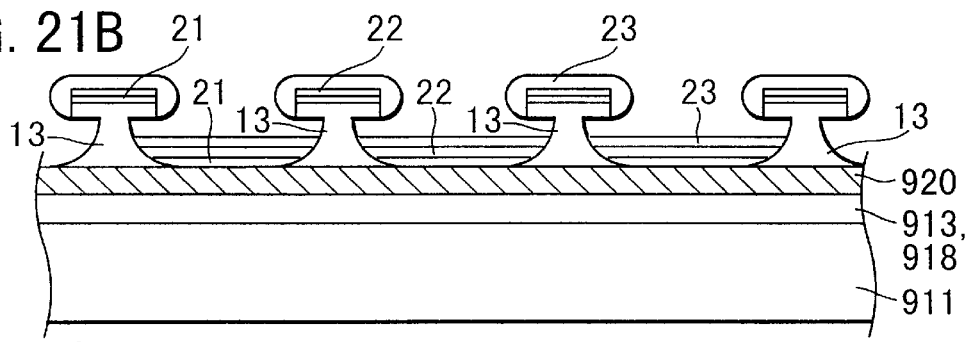
FIG. 22 is a cross sectional view schematically showing an organic EL display element using the substrate for an organic EL display element equipped with a partition wall, which is shown in FIGS. 21A and 21B.

FIG. 22 shows how to manufacture an organic EL display element by using the substrate for an organic EL display element provided with partition walls as shown in FIGS. 21A and 21B. In the first step, the organic EL medium layer 21 is formed by, preferably, a vacuum vapor deposition as described previously on the substrate for an organic EL display element provided with the partition walls, followed by forming the second electrode lines 22 by, preferably, a vacuum vapor deposition method on the organic EL medium layer 21. Further, the sealing layer 23 is formed on the second electrode line 22 by, preferably, an ion plating method. Each of these organic EL medium layer 21 and the second electrode material layer 22 is patterned when formed by the presence of the partition walls 13, making it unnecessary to apply an etching treatment separately. The sealing layer 23, which consists of germanium oxide, can be formed in a thickness of, for example, 1 μm.

Figure 23:
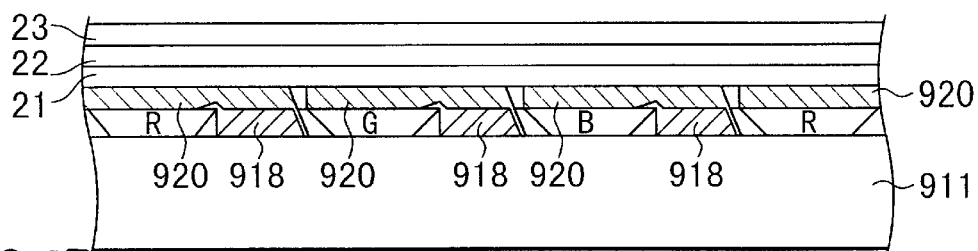
FIG. 23 is a cross sectional view schematically showing another organic EL display element of the present invention equipped with a conductive bus line.
Figure 24:
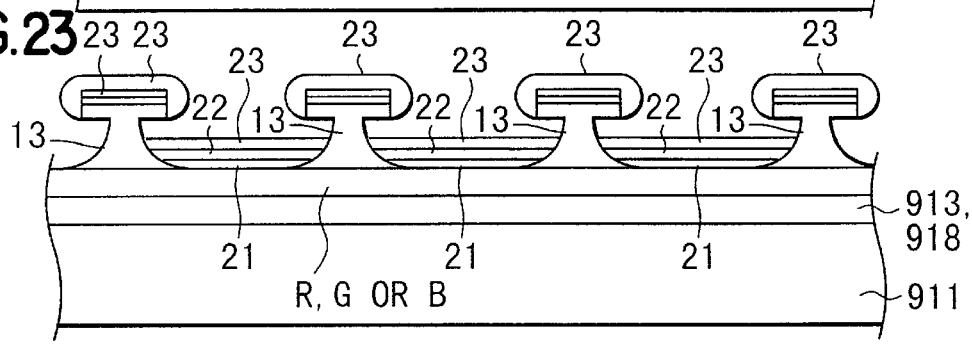
FIG. 24 is a cross sectional view schematically showing still another organic EL display element of the present invention equipped with a conductive bus line.

In the present invention, the insulating layer 913 can be formed of color filter layers (R, G, B) as shown in FIGS. 23 and 24. FIG. 23 is a cross sectional view corresponding to FIG. 20I, and FIG. 24 corresponds to FIG. 22. FIG. 23, which shows the final construction of the organic EL display element, should be construed to show also the substrate for an organic EL display element corresponding to that shown in FIG. 20H. Likewise, FIG. 24, which shows the final construction of organic EL display element provided with partition walls, should be construed to show also the substrate for an organic EL display element corresponding to that shown in FIG. 20H and the substrate for an organic EL display element provided with partition walls corresponding to that shown in FIGS. 21A and 21B.

A substrate for an organic EL display element according to a third embodiment of the present invention will now be described with reference to FIG. 25.

Figure 25:
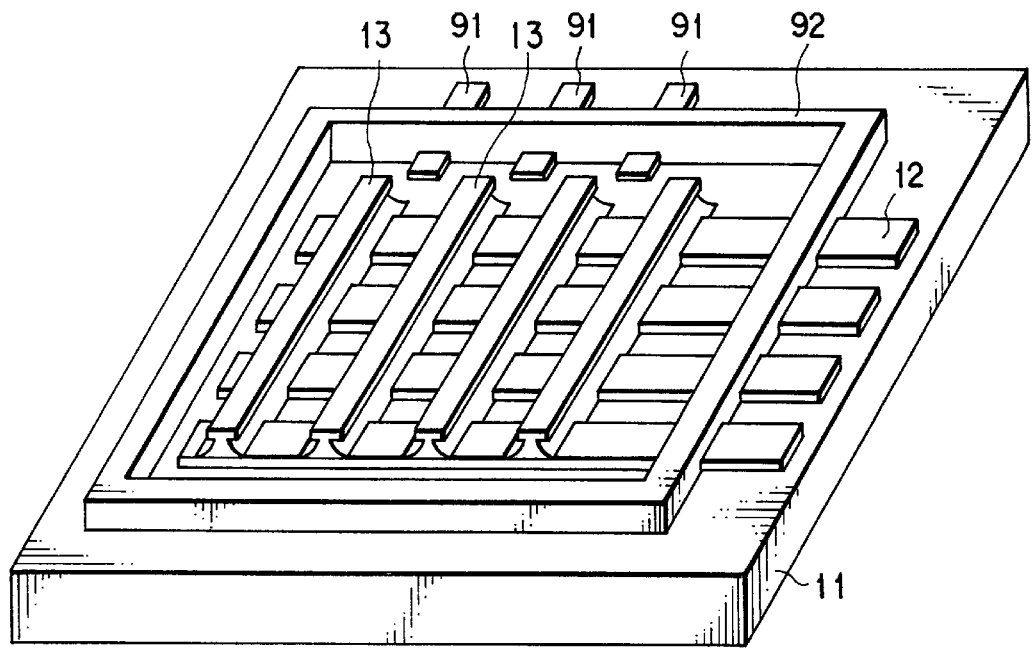
FIG. 25 is an oblique view schematically showing a substrate for an organic EL display element equipped with a frame.

As shown in FIG. 25, a plurality of striped first electrode lines 12 (anode lines in this embodiment) are formed on a support 11 made of a light-transmitting insulating material such as quartz, glass or a plastic material, preferably a transparent material. Further, it is desirable to form a plurality of striped auxiliary electrode lines 91 in a region between an edge of the support and a region surrounding the first electrode lines. These auxiliary electrode lines 91 are formed apart from the first electrode lines 12 in a manner to extend from within a region surrounded by a frame 92 described later to the outside of the frame 92. Naturally, the auxiliary electrode lines 91 cross the frame 92 and can be used as electrodes that are connected to second electrode lines described later. FIG. 25 shows that the first electrode lines 12 are arranged a predetermined distance apart from each other, and that the auxiliary electrode lines 91 are also arranged apart from each other. It is also shown that the auxiliary electrode lines 91 extend from a position a predetermined distance apart from one side edge of the first electrode line 12 toward the edge of the support in a direction perpendicular to the first electrode line 12.

The plural first electrode lines 12 can be formed by forming an electrode material layer on the upper surface of the support 11, followed by patterning the electrode material layer by, for example, the ordinary photolithography technology. Preferably, the auxiliary electrode lines 91 should be formed after formation of the first electrode lines 12. To be more specific, an electrode material layer for the auxiliary electrode is formed on the front surface of the support 11, followed by patterning the electrode material layer by, for example, a photolithography technology as in the formation of the first electrode lines 12. Preferably, the first electrode lines 12 and the auxiliary electrode lines 91 should be formed simultaneously by using the same electrode material.

In the example shown in FIG. 25, the first electrode lines 12 constitute the anode. Therefore, it is desirable to use a transparent conductive material such as indium tin compound oxide (ITO), indium zinc compound oxide or zinc aluminum compound oxide for forming the first electrode lines 12. The same electrode material can also be used for forming the auxiliary electrode lines 91.

These electrode materials can be deposited on the support 11 by a sputtering method.

The frame 92 surrounds the first electrode lines 12 formed on the support 11 and the partition walls 13 arranged apart from each other and extending to cross the electrode lines 12. Preferably, the frame 92 should be arranged to cross the first electrode lines 12 such that the first electrode lines 12 extend to the outside of the frame 92. Also, in a preferred embodiment in which the auxiliary electrode lines 91 are formed, the frame 92 should be formed to cross the auxiliary electrode lines 91 such that the auxiliary electrode lines 91 extend from within the frame 91 to the outside of the frame 91.

It is desirable to employ the method of the present invention described above for forming the partition walls 13 and the frame 92.

In the present invention, the partition walls 13 and the frame 92 can be formed simultaneously by using the same material. It is desirable to form the partition walls 13 and the frame 92 simultaneously by using the same material, though it is also possible to form these partition walls and frame separately by using different materials.

It is possible to employ the particular method of the present invention in combination with a method known in this technical field to form the partition walls 13 and the frame 92 in various shapes. It is desirable for the partition wall 13 to have eaves and a flare. However, the frame 92 may have a vertical side surface as shown in FIG. 25. FIG. 25 also shows that the partition walls 13 are arranged apart from each other and extend in a direction perpendicular to the first electrode lines 12, and that the frame 92 is shaped rectangular to permit the first electrode lines 12 and the auxiliary electrode lines 91 to cross the frame 91 at right angles.

These frame 92 and partition walls 13 are irradiated with an electron beam or a UV light and, then, subjected to post-baking so as to finish preparation of the substrate for an organic EL display element of the present invention. The final height of these partition wall 13 and frame 92 should desirably be 1 to 50 μm.

An organic EL display element of the present invention provided with a frame will now be described with reference to FIG. 26.

Figure 26:
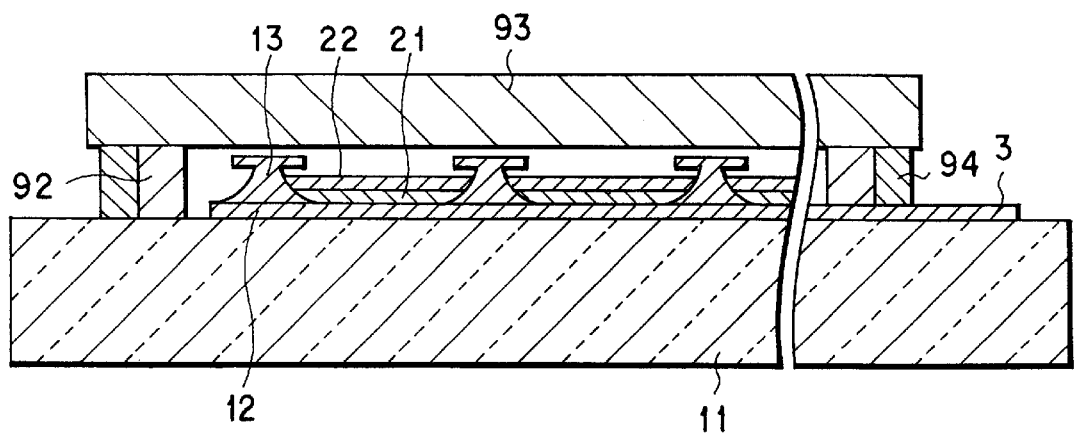
FIG. 26 is a cross sectional view schematically showing an organic EL display element of the present invention in which a cover is mounted on a frame.

As shown in FIG. 26, the organic EL medium layer 21 is formed in at least the region between adjacent partition walls 13, and the second electrode line 22 is formed on the organic EL medium layer 21.

Where the auxiliary electrode line 91 is formed as in the preferred embodiment described above, the auxiliary electrode line 91 can be connected to the second electrode line 22. In this embodiment, the first electrode line 12 constitutes the anode and, thus, the second electrode line 22 constitutes the cathode.

A cover 93 is mounted on the frame 92.

The cover 93 covers at least the top surface of the frame 92 and the region surrounded by the frame 92 and includes preferably a portion extending outward from the outer edge of the top surface of the frame 92. FIG. 26 shows that the cover 93 is shaped like a flat plate and includes a portion extending outward from the side edge of the top surface of the frame 92 over the entire periphery, though the extending portion is not clearly shown in the drawing.

The cover 93 can be formed of glass, a metallic material, etc.

In the present invention, it is possible to reduce the pressure within the space surrounded by the frame 92 and the cover 93. The pressure reduction permits decreasing the water content and oxygen content within the space surrounded by the frame 92, the cover 93 and the support 11, making it possible to prevent the second electrode line 22 and the organic EL medium layer 21 from being deteriorated. After the pressure reduction, an inert gas can be sealed in the space noted above.

The frame 92 and the cover 93 are bonded to each other by an adhesive 94. Particularly, it is most desirable to have the outer peripheral surface of the frame 92 coated with the adhesive 94. In this case, the adhesive 94 cannot move into a region inside the frame 92 so as to prevent without fail the adhesive 94 from contacting the second electrode line 22 and the organic EL medium 21. In a preferred embodiment in which the cover 93 includes a region slightly extending outward from the outer edge of the top surface of the frame 92, the adhesive layer can be formed in a region surrounded by the lower surface at the edge of the cover extending outward from the outer edge of the top surface of the frame 92, the outer circumferential surface of the frame 92 and the upper surface of that portion of the support which is positioned outward of the frame 92. In this case, the adhesive 94 cannot move into a region inside the frame 92. In addition, the support 11, the frame 92 and the cover 93 can be bonded integrally. FIG. 26 shows that the adhesive 94 is coated on the entire outer circumferential surface of the frame 92.

An ordinary resin that can be cured at room temperature can be used as the adhesive 94. However, it is desirable to use a UV-setting resin that can be cured rapidly in order to achieve bonding efficiently.

In the substrate for an organic EL display element of the present invention, a frame is formed in advance on the support. Therefore, the second electrode line 22 and the organic EL medium 21 can be covered easily by simply mounting, for example, a flat cover 93. Also, the presence of the frame 92 makes it possible to avoid the possibility of erroneously bringing the cover into contact with the second electrode line 22 in the step of mounting the cover.

The present invention will now be described with reference to Examples.

EXAMPLE 1

A substrate for an organic EL display element and an organic EL display element were prepared in this Example by the methods described previously in conjunction with FIGS. 4A to 7B.

In the first step, an ITO layer for the first electrode line was formed on a glass support 11 by means of sputtering. Then, for improving both the transparency and electrical conductivity of the first electrode line, a heat treatment was applied to the ITO layer within an air atmosphere so as to crystallize the ITO layer.

Then the ITO layer was patterned by photolithography and wet etching so as to form the first electrode line 12 (see FIGS. 4A and 4B).

In the next step, the support 11 having the first electrode line 12 formed thereon was coated with a negative photosensitive resin having fine graphite particles acting as a black coloring matter dispersed therein, followed by pre-baking, exposing to light, developing, and post-baking the photosensitive resin layer to form partition walls 13 each having eaves and flares, thereby forming a substrate for an organic EL display element of the present invention (see FIGS. 5A and 5B).

Then, the organic EL medium layer 21 of a three-layer structure was formed by vacuum vapor deposition of copper phthalocyanine (20 nm thick), N,N'-di(1-naphthyl)-N,N'-diphenyl-1,1'-biphenyl-4,4'-diamine (60 nm thick) and tris (8-quinolinolato)aluminum complex (70 nm thick), followed by forming the second electrode line on the organic EL medium layer 21 by vapor deposition of aluminum that was carried out while rotating the substrate (see FIGS. 6A and 6B). Further, the sealing layer 23 was formed in a thickness of 1 μm by ion plating of germanium oxide so as to prepare the organic EL display element of the present invention (see FIGS. 7A and 7B).

Figure 27:
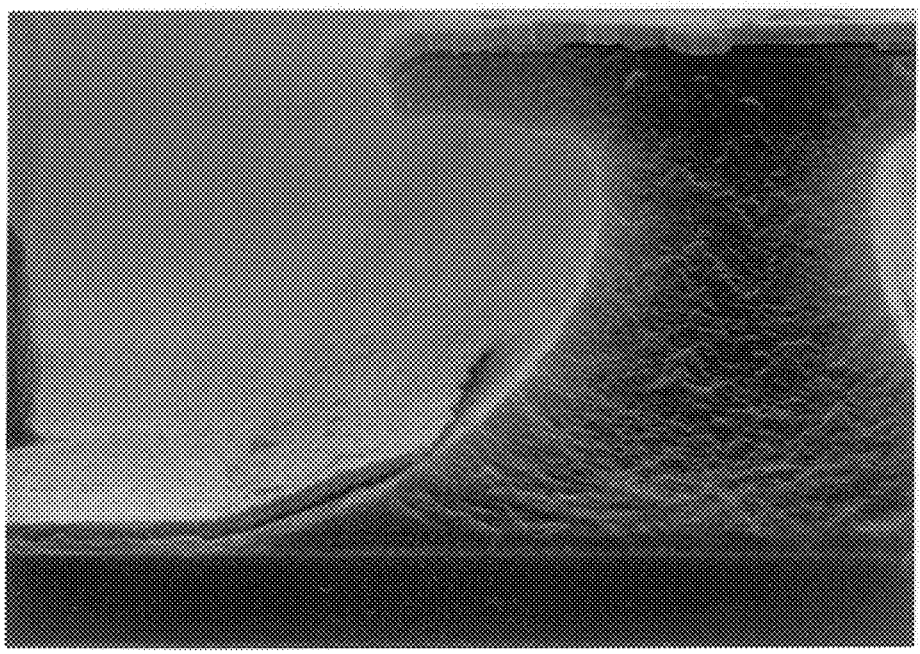
FIG. 27 is an SEM photograph showing the structure that an organic EL medium and a second electrode layer were formed by vapor deposition in Example 1 described herein later in detail by using a partition wall of the present invention.

FIG. 27 is an SEM photo showing the state after the vapor deposition for forming the EL medium and the second electrode layer by using partition walls of the present invention. It is seen from FIG. 27 that the EL medium and the second electrode layer are patterned to form a stripe between adjacent partition walls, and that the end portions on both sides of the second electrode line extend over the lower portions of the flares of the light-absorbing partition wall so as to cover completely the EL medium.

In the organic EL display element thus prepared, the second electrode lines were completely separated from each other so as to eliminate completely the short-circuiting between adjacent second electrode lines. Also, the short-circuiting of the element at the edge of the second electrode line was not observed even if the driving voltage was increased to 10V or more.

EXAMPLE 2

Figure 28:
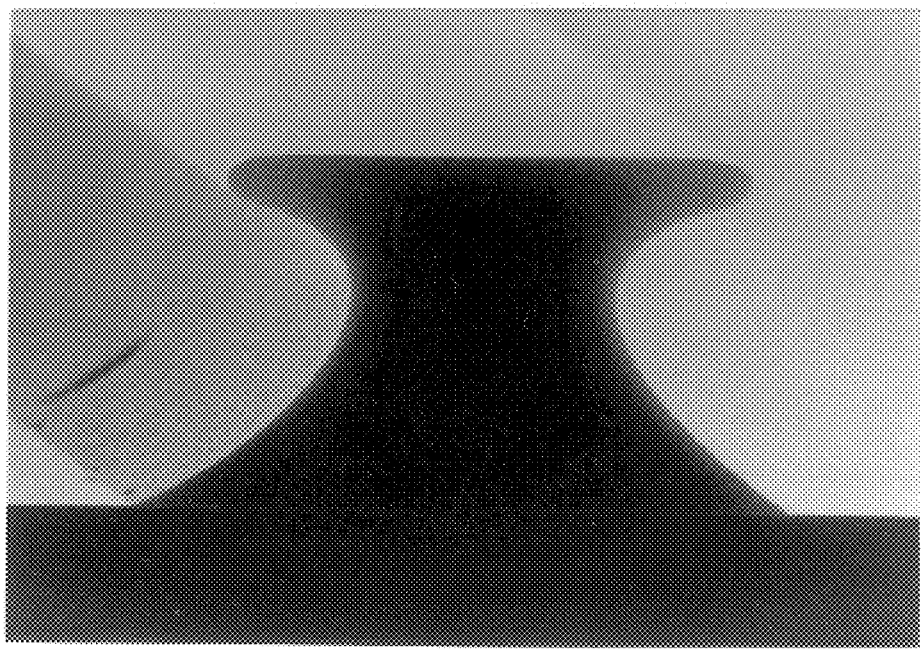
FIG. 28 is an SEM photograph showing a partition wall of a substrate for an organic EL display element prepared in Example 2 described herein later in detail.

A substrate for an organic EL display element and an organic EL display element were prepared as in Example 1, except that a triazine-based organic UV-absorbing substance was used in place of the fine black graphite particles. FIG. 28 is an SEM photo showing the partition wall of the substrate for the display element thus prepared. The display element was found to be substantially equal in performance to the element prepared in Example 1.

EXAMPLE 3

A substrate for an organic EL display element and an organic EL display element were prepared as in Example 1, except that a mixed coloring matter consisting of an anthraquinone-based red coloring matter and copper phthalocyanine-based green and blue coloring matters was used in place of the fine black graphite particles. The display element was found to be substantially equal in performance to the element prepared in Example 1.

EXAMPLE 4

A substantially entire surface of the partition wall 13 prepared as in Example 1 was irradiated with an electron beam or a UV light, followed by applying a post-baking at 150 to 300° C. for 10 to 120 minutes so as to prepare a substrate for an organic EL display element of the present invention. Then, an organic EL display element was prepared as in Example 1. In the organic EL display element thus prepared, the second electrode lines were found to be completely separate from each other so as to eliminate completely the short-circuiting between adjacent second electrodes. Also, the short-circuiting at the edge of the second electrode line was not observed even if the driving voltage was increased to 10V or more.

Comparative Example 1

An organic EL display element was prepared as in Example 1, except that the partition wall was prepared by using a negative photosensitive resin not having a black coloring matter dispersed therein after formation of the first electrode line 12 as in Example 1. The flare edge angle of the organic EL display element was found to be 45° or more, and the upper portion of the side surface of the partition wall was free from eaves. Short-circuiting was caused in a part of the second electrode line by a substance attached by vapor deposition to the side surface of the partition wall. Also, short-circuiting took place between the edge of the second electrode line and the first electrode line when the driving voltage was increased to 10V or more.

<Influence given by Edge Angle>

Samples of partition walls each having a flare edge angle of about 30°,45° and 60° were prepared for comparison with the sample of the partition wall that did not have flared side surfaces. In the samples of the partition walls each having a flare edge angle of 30° and 45°, short-circuiting did not take place even if a voltage of 10V was applied between the first and second electrodes. On the other hand, short-circuiting was observed in about 5% of 4096 samples of the partition walls having a flare edge angle of 60°. Also, short-circuiting was observed in about 15% of the samples not having flared side surfaces.

<Influences given by Flare Width and Height of Partition Wall>

Short-circuiting was not observed under application of 10V in the samples of partition walls having a height of 2.5 $\mu$m and a flare width of 0.3 $\mu$m. On the other hand, short-circuiting was observed in about 5% of 4096 samples of the partition walls having a flare width of 0.2 $\mu$m. When it comes to the samples of partition walls having a height of 10 $\mu$m and an average flare width of about 50 $\mu$m, a large non-uniformity ranging between 30 $\mu$m and 100 $\mu$m was found in the flare width. Short-circuiting was not observed under application of 10V. However, the shapes of the pixels were found to be nonuniform. Further, in the samples in which the target value of the flare width was set at 100 $\mu$m, a residual film was found in the pixel portion.

EXAMPLE 5

Prepared were a substrate for an organic EL display element, in which the first and second electrodes constituted the cathode and the anode, respectively, and an organic EL display element.

In the first step, an aluminum film for forming the first electrode line was formed on the glass support 11, followed by pattering the aluminum layer to form a stripe by the ordinary photo etching method. Then, the partition wall 13 was formed by using a negative resist having a glass powder dispersed therein, followed by forming a LiF layer by means of vapor deposition. Further, a layer of tris(8-quinolinolato) aluminum, a layer of N,N'-di(1-naphtyl)-N,N'-diphenyl-1, 1'-biphenyl-4,4'-diamine, and a layer of copper phthalocyanine were formed by vapor deposition in the order mentioned to form an organic EL medium layer of a three-layer structure, followed by forming an indium zinc compound oxide layer by vapor deposition to form the second electrode line. In this case, display is performed on the side of the second electrode line. Short-circuiting was not observed under application of 10V.

EXAMPLE 6

A substrate for an organic EL display element was prepared by the method described previously in conjunction with FIGS. 9A to 12B.

In the first step, an ITO layer was formed in a thickness of 0.1 $\mu$m on the glass support member 11 by means of a sputtering method. Then, in order to improve the transparency and the electrical conductivity of the ITO layer, a heat treatment was applied to the ITO layer under an air atmosphere for crystallizing the ITO layer.

In the next step, the ITO layer was patterned by photolithography and wet etching so as to form a plurality of the first electrode lines 12, as shown in FIGS. 9A and 9B. Each of the first electrode lines 12 was 270 $\mu$m wide and the distance between adjacent electrode lines 12 was 30 $\mu$m.

The support 11 having the first electrode lines 12 formed thereon was coated with a negative photoresist having 1 to 15% by weight of a black coloring matter consisting of fine graphite particles dispersed therein to form a photoresist film 32, followed by pre-baking the photoresist film 32.

In the next step, a UV light exposure was applied from the front surface by using the photo mask 41 so as to expose the region 132' corresponding to the top portion of the partition wall to the UV light, as shown in FIGS. 10A and 10B. The width of the exposed region 132' was 30 $\mu$m.

Then, an additional UV light exposure was applied from the back surface by using another photo mask 43 so as to expose the region 133' corresponding to the bottom portion of the partition wall to the UV light, as shown in FIG. 11A and 11B. The width of the exposed region 133' was 50 μm.

Then, the partition wall 13 having eaves and flares was formed by the development with an alkaline developing solution, as shown in FIGS. 12A and 12B.

Finally, post-baking was performed by irradiation with an electron beam or a UV light so as to finish preparation of a substrate for an organic EL display element. The width of the flare was limited by the photo mask 43 so as to eliminate the nonuniformity caused by the developing conditions.

EXAMPLE 7

A substrate for an organic EL display element was prepared by the method described previously in conjunction with FIGS. 14A to 15B.

Specifically, a substrate for an organic EL display element was prepared as in Example 6, except that the photo mask 43' shown in FIGS. 14A and 14B was used for the back surface light exposure. The width of the connection band 51 was 50 μm.

EXAMPLE 8

A substrate for an organic EL display element was prepared by the method described previously in conjunction with FIGS. 16A to 17B.

Specifically, color filters of three colors RGB were formed on the glass support 11 by photolithography, followed by forming an over-coat layer 62 consisting of a transparent resin on the color filters 61.

Then, the first electrode lines 12 and the negative photoresist layer 32 were formed on the over-coat layer 62 as in Example 6, followed by applying a light exposure to the region 132' corresponding to the top portion of the partition wall.

In the next step, the entire back surface of the support 11 was irradiated with a UV light emitted from below the support 11. In this step, the color filters 61 were used as a mask without using a photoresist mask prepared separately so as to expose the region 133' corresponding to the bottom portion of the partition wall to the UV light (FIGS. 16A and 16B).

Finally, the photoresist layer was developed as in Example 6, followed by electron beam irradiation and post-baking to finish preparation of a substrate for an organic EL display element (FIGS. 17A and 17B).

EXAMPLE 9

A substrate for an organic EL display element was prepared by the method described previously in conjunction with FIGS. 18A to 18C.

Specifically, the first electrode lines 12 and the negative photoresist layer 32 were formed on the support 11 as in Example 6, followed by exposing the region 132' corresponding to the top portion of the partition wall to light and subsequently developing the photoresist layer 32 with a developing solution to cause the continuous film 511 to remain in a thickness of 0.5 μm between adjacent regions corresponding to partition walls (FIG. 18A).

Then, the front surface of the photoresist layer 32 was irradiated with a UV light emitted from above the layer 32 using the photoresist mask 71 so as to expose the region 511a corresponding to the lower end portion of the flared side surface of the partition wall to the UV light (FIG. 18B).

Further, the structure shown in FIG. 18B was developed with a developing solution to form the partition walls 13 (FIG. 18C).

Finally, irradiation with an electron beam or a UV light and post-baking were applied as in Example 5 so as to finish preparation of the substrate for an organic EL display element.

EXAMPLE 10

An organic EL display element was prepared by the method described previously in conjunction with FIGS. 19A to 19D by using the substrate for the organic EL display element prepared in Example 7.

In the first step, a layer of copper phthalocyanine, a layer of N,N'-di(1-naphthyl)-N,N'-diphenyl-1,1'-biphenyl-4,4'-diamine and a layer of tris(8-quinolinolato) were formed by vacuum vapor deposition successively in the order mentioned on the surface of the substrate 80 for the organic EL display element prepared in Example 7 (FIG. 19A) so as to form the organic EL medium 21 (FIG. 19B). The organic EL medium layer 21 of the three-layer structure thus formed was found to be 0.1 μm thick.

Then, the second electrode line 22 was formed by vacuum vapor deposition of aluminum, which was carried out while rotating the support 11, as shown in FIG. 19C.

Figure 19D:
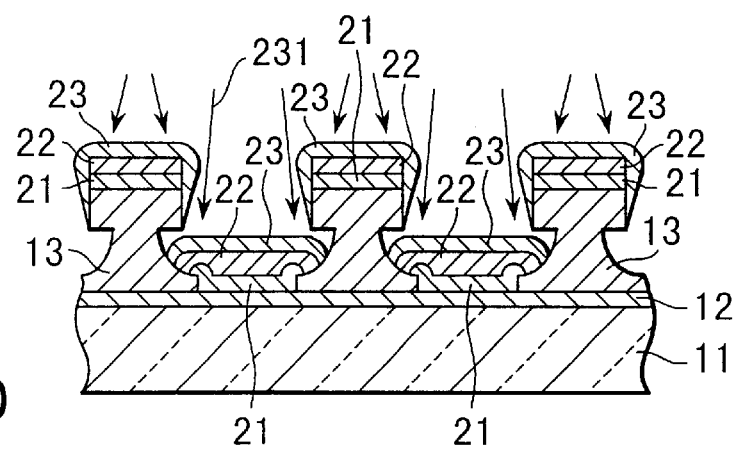

Finally, the sealing layer 32 consisting of germanium oxide was formed by an ion plating method so as to finish preparation of the organic EL display element (FIG. 19D). Since the mutually facing edge portions of the adjacent first electrode lines were covered with the connection band, it was possible to prevent completely the short-circuiting between the first electrode line 12 and the second electrode line 22 at the mutually facing edge portions noted above.

EXAMPLE 11

A substrate for an organic EL display element was prepared by the method described previously in conjunction with FIGS. 20A to 20H.

In the first step, a glass support 911 was coated with a negative photoresist having a UV-absorbing substance or a coloring matter dispersed therein, followed by drying the coating to form the photoresist layer 912 (FIG. 20A).

Then, a UV light exposure and development were applied to the resist layer 912 by using a striped photo mask having a pitch of 300 μm and a width of 20 μm to form an insulating layer 913 that was inversely tapered, (FIG. 20B).

In the next step, a copper layer 914 having a thickness substantially equal to that of the insulating layer 913 was formed by a sputtering method on the glass support 911 having the insulating layer 91 formed thereon (FIG. 20C).

Then, a photoresist layer 916 was formed on the copper layer 914 (FIG. 20D).

A UV light exposure and development were applied to the photoresist layer 916 to form a desired resist pattern 917 (FIG. 20E).

Then, the copper layer 914 was selectively etched, followed by removing the resist pattern 917 to form a desired copper bus line 918 (FIG. 20F).

After formation of the copper bus line 918, an ITO pattern was formed by a sputtering method in a thickness of 0.1 μm. Since the insulating film 913 was inversely tapered, the ITO layer 920 was cut when formed at one side end portion 913A of the insulating film 913, with the result that the ITO layer 920 was automatically patterned (FIG. 20G).

Finally, the clearance 919 between the insulating layer 913 and the copper bus line 918 was filled with the negative photoresist 921 so as to finish preparation of the substrate for an organic EL display element (FIG. 20H).

EXAMPLE 12

Partition walls 13 extending in a direction perpendicular to the ITO line 920 and the copper bus line 918 were formed by the method described previously in conjunction with FIGS. 8A to 8D on the substrate for the organic EL display element prepared in Example 11 so as to prepare a substrate for an organic EL display element equipped with partition walls, as shown in FIG. 20I.

EXAMPLE 13

Color filter layers (R,G,B) were substituted for the insulating layer 913 included in each of the substrate for an organic EL display element and the substrate for an organic EL display element equipped with the partition walls prepared in Examples 11 and 12, respectively, so as to prepare a substrate for an organic EL display element equipped with color filters and a substrate for an organic EL display element equipped with both color filters and partition walls (see FIGS. 23 and 24).

EXAMPLE 14

An organic light-emitting layer 21 and the second electrode line 22 were formed successively by vacuum vapor deposition in the order mentioned on each of the substrate for an organic EL display element prepared in Example 11 and the substrate for an organic EL display element equipped with partition walls, which was prepared in Example 12, followed by forming the sealing layer 23 so as to prepare the organic EL display elements of the present invention (FIGS. 20I and 22).

EXAMPLE 15

An organic light-emitting layer 21 and the second electrode line 22 were formed successively by vacuum vapor deposition in the order mentioned on each of the substrate for an organic EL display element equipped with color filters, and the substrate for an organic EL display element equipped with color filters and partition walls, said substrates being prepared in Example 13, followed by forming the sealing layer 23 so as to prepare the organic EL display elements of the present invention (FIGS. 23 and 24).

The resistance of the first electrode lines included in each of the organic EL display elements prepared in Examples 11 to 15 was found to be markedly lower than that of the conventional element.

EXAMPLE 16

A substrate for an organic EL display element constructed as shown in FIG. 25 was prepared in this Example.

In the first step, an ITO layer was formed by a sputtering method in a thickness of 0.1 $\mu$m on the glass support 12. For further improving the transparency and the electrical conductivity of the ITO layer, a heat treatment was applied to the ITO layer at 230° C. for one hour under an air atmosphere so as to crystallize the ITO layer.

Then, the ITO layer was patterned by photo-lithography and wet etching to form a plurality of the first electrode lines 12 and a plurality of the auxiliary electrode lines 91. Each of the first electrode lines 12 was found to have a width of 200 $\mu$m, and the distance between adjacent first electrode lines 12 was found to be 50 $\mu$m.

In the next step, the glass support member 11 was coated with a negative photoresist having a black coloring matter consisting of fine graphite particles dispersed therein, followed by pre-baking the coated photoresist layer.

Then, a UV light exposure was performed by using a photo mask so as to expose the regions corresponding to the top portions of the partition walls 13 and the regions corresponding to the top portion of frame 92 to the UV light.

Thereafter, development was performed by using an alkaline developing solution to form the partition walls 13 and the frame 92.

Further, the entire surfaces of the partition walls 13 and the frame 92 were irradiated with an electron beam or a UV light, followed by post-baking at 150 to 300° C. for 10 to 120 minutes, thereby finishing preparation of a substrate for an organic EL display element. The final height of the partition wall 13 was 4.5 $\mu$m, and the final height of the frame 92 was 5 $\mu$m.

EXAMPLE 17

An organic EL display element constructed as shown in FIG. 26 was prepared by using the substrate for an organic EL display element prepared in Example 16.

In the first step, a layer of copper phthalocyanine having a thickness of 20 nm, a layer of N,N'-di(1-naphtyl)-N,N'-diphenyl-1,1'-biphenyl-4,4'-diamine having a thickness of 60 nm, and a layer of tris(8-quinolinolato) aluminum complex having a thickness of 70 nm were formed successively in the order mentioned by vacuum vapor deposition on the substrate for an organic EL display element prepared in Example 16 so as to form the organic EL medium layer 21 of a three-layer structure.

Then, the second electrode lines 22 were formed by vacuum vapor deposition of an Mg/Ag alloy while rotating the glass support 11. The thickness of the second electrode line 22 was 0.2 $\mu$m.

Further, the glass cover 93 was disposed on the frame 92, and the pressure within the space defined by the substrate for the organic EL display element, the frame 92 and the glass cover 93 was reduced, followed by coating the outer circumferential surface of the frame 92 with a UV-setting resin (or adhesive) 94. Finally, the glass cover 93 was bonded to the glass support 11 with the adhesive 94 so as to finish preparation of the organic EL display element.

The organic EL display element exhibited excellent properties. Specifically, the initial brightness of the element was 300 cd/m$^2$ and the half-life was 5000 hours. This clearly supports that the residual water, oxygen, etc. can be decreased by the pressure reduction so as to suppress deterioration of the organic EL display element. It should also be noted that, since the frame is formed in advance, the cover is not brought into contact with the second electrode, etc. when the cover is mounted on the frame 92. In addition, the adhesive is prevented without fail from being fluidized so as to be brought into contact with the second electrode lines and the organic EL medium layer.

EXAMPLE 18

An organic EL medium layer and second electrode lines were formed as in Example 17 by using the substrate for the organic EL display element prepared as in Example 16. Then, a glass cover was disposed, followed by reducing the pressure within the space defined by the substrate for the organic EL display element, the frame and the glass cover. Further, an argon gas was sealed in the space having a reduced pressure, followed by coating the outer circumferential surface of the frame with an adhesive and subsequently bonding a glass cover so as to finish preparation of an organic EL display element.

The organic EL display element exhibited excellent properties. Specifically, the initial brightness of the element was 300 cd/m$^2$ and the half-life was 4000 hours. This clearly supports that the residual water, oxygen, etc. can be decreased by the pressure reduction so as to suppress deterioration of the organic EL display element. It should also be noted that, since the frame is formed in advance as in Example 17, the cover is not brought into contact with the second electrode, etc. when the cover is mounted on the frame 92. In addition, the adhesive is prevented without fail from being fluidized so as to be brought into contact with the second electrode lines and the organic EL medium layer.

EXAMPLE 19

Organic EL display elements were prepared as in Examples 17 and 18, except that the pressure within the space defined by the substrate for the organic display element, the frame and the glass cover was not reduced, and an inert gas was not sealed in the space noted above, respectively.

Each of the organic EL display elements thus prepared exhibited an initial brightness of 300 cd/m$^2$, which was equal to that of the elements prepared in each of Examples 17 and 18. However, the elements prepared in Example 19 were somewhat inferior in the resistance to deterioration to the elements prepared in Examples 17 and 18.

In the above description, the features of the preset invention were explained in accordance with several embodiments of the invention. However, it may be obvious to those skilled in the art that these features can be combined depending on the object. In other words, the present invention can be worked in various modes other than those shown in the drawings within the technical scope of the present invention. For example, in each of the embodiments described above, the first electrode line is made of an anode material, and the second electrode line is made of a cathode material. However, it is also possible for the first and second electrode lines to be made of a cathode material and an anode material, respectively.

As described above, according to the first aspect of the present invention, it is possible to provide a substrate for an organic electroluminescence (EL) display element, in which the limitation in the direction of the vapor deposition beam is small to make the substrate adapted for a uniform vapor deposition over a large area and which does not require an insulating layer for preventing short-circuiting. It is also possible to provide a substrate for an organic EL display element that suppresses the light transmitted from the back surface and the reflection of the external light. It is also possible to provide an organic EL display element that is unlikely to bring about short-circuiting by insulation breakdown and is unlikely to be deteriorated. Further, it is possible to provide easily a substrate for such an organic EL display element.

The substrate for an organic EL display element of the present invention comprises a partition wall having eaves and flared side surfaces and serving to separate the organic EL medium/second electrode line. In preparing the particular partition wall, it is possible to control accurately the widths of not only the eaves but also the flared side surfaces of the partition wall. In addition, a connection band serving to connect adjacent partition walls is formed to cover the mutually facing side edges of the first electrode. As a result, it is possible to prevent without fail the short-circuiting between the first and second electrode lines at the side edge portions of the first electrode line.

According to the second aspect of the present invention, it is possible to lower the driving voltage of an organic El display element by arranging a conductive bus line in a region between a transparent conductive film line acting as a first electrode line and a support. The conductive bus line is arranged below the transparent conductive film line in contact with the transparent conductive film. According to the present invention, the thickness of the conductive bus line thus arranged is not limited by the thickness of the transparent conductive film, making it possible to further lower the resistance of the first electrode line. Also, the conductive bus line performs the function of a black stripe so as to improve the contrast of the El display element. Further, where the insulating layer or the color filters are tapered inversely, the transparent conductive film is automatically patterned when formed, making it possible to omit the patterning step of the transparent conductive film.

Further, according to the third aspect of the present invention, the substrate for an organic EL display element comprises partition walls and a frame. The second electrode line and the organic EL medium can be covered simply disposing a cover on the frame. Also, since the frame is formed in advance in the substrate, the cover is prevented from being brought into contact with the second electrode line when the cover is disposed on the frame. Further, since the pressure within the space surrounded by the frame and the cover can be reduced, it is possible to decrease the amounts of the residual water, oxygen, etc. As a result, it is possible to suppress deterioration of the second electrode line and the organic EL medium. Still further, where an adhesive for bonding the cover is coated on the outer circumferential surface of the frame, the adhesive cannot flow into the inner region of the frame. It follows that it is possible to prevent without fail the adhesive from being brought into contact with the second electrode line and the organic EL medium.

What is claimed is:

1. A substrate for an organic electroluminescence display element, comprising:
    a support;
    a plurality of first electrode lines arranged apart from each other on said support; and
    a plurality of partition walls arranged apart from each other on said support and extending in a direction crossing said first electrode lines, each of said partition walls having eaves in an upper portion thereof and flares in a lower portion thereof,
    wherein said flares are longer than the eaves in a direction parallel to said support.

2. A substrate according to claim 1, wherein said partition wall has a flare edge angle of 45° or less.

3. A substrate according to claim 1, wherein said partition wall is formed as a whole of the same substance.

4. A substrate according to claim 1, wherein the width of the flare of said partition wall is 0.1 to 10 times as much as the height of the partition wall.

5. A substrate according to claim 1, wherein said partition wall is formed of a photosensitive resin containing a UV-absorbing substance.

6. A substrate according to claim 5, wherein said partition wall contains a UV-absorbing substance.

7. A substrate according to claim 1, wherein, where said partition wall is colored black, the partition wall forms a light-absorbing partition wall that also acts as a black stripe.

8. An organic electroluminescence display element, comprising an organic EL medium and a second electrode line mounted on a substrate according to claim 1.

9. A display element according to claim 8, wherein both edge portions of the organic EL medium and the second electrode line extend over the flared lower side surfaces of adjacent partition walls so as not to be brought into contact with the first electrode line.

10. A display element according to claim 8, wherein said second electrode line extends from an edge of said organic EL medium to the outside to cover the EL medium.

11. A method of manufacturing a substrate for an organic electroluminescence display element defined in claim 1, comprising coating a support having a plurality of first electrode lines formed thereon with a negative photosensitive resin layer; for said negative photosensitive resin layer, applying a light exposure to expose a plurality of regions corresponding to the top portions including the eaves of partition walls to light; developing the non-exposed portion to form said partition walls; and then irradiating the partition walls with radiation selected from an electron beam and an ultraviolet light, followed by a post-baking.

12. A method of manufacturing a substrate according to claim 1, comprising forming a negative photoresist film on a support having first electrode lines formed thereon; for the negative photoresist film, applying, a first light exposure to expose regions corresponding to top portions including the eaves of partition walls to light, and a second light exposure to expose at least the flare portions of the partition walls to light; and developing the non-exposed portion to form said partition walls.

13. A method according to claim 12, wherein the region to which said second light exposure is applied includes a region corresponding to a connection band serving to connect adjacent partition walls.

14. A method according to claim 12, wherein said first light exposure and said second light exposure are conducted simultaneously.

15. A method according to claim 12, wherein said first light exposure and said second light exposure are conducted one before the other.

16. A method of manufacturing a substrate according to claim 1, comprising forming a negative photoresist film on a support having first electrode lines formed thereon; for the negative photoresist film, applying, a first light exposure to exposure regions corresponding to top portions including the eaves of partition walls to light, and a second light exposure to exposure the bottom portions of the partition walls; and developing the non-exposed portion to form said partition walls.

17. A method according to claim 16, wherein the region to which said second light exposure is applied includes a region corresponding to a connection band serving to connect adjacent partition walls.

18. A method according to claim 16, wherein said first light exposure and said second light exposure are conducted simultaneously.

19. A method according to claim 16, wherein said first light exposure and said second light exposure are conducted one fore the other.

20. A method of manufacturing the substrate for an organic electroluminescence display element defined in claim 1, comprising forming a negative photoresist film on a support having first electrode lines formed thereon; applying a first light exposure to said negative photoresist film to expose regions corresponding to top portions including the eaves of partition walls to light; developing the non-exposed portion in a predetermined thickness; applying a second light exposure to said negative photoresist film to expose at least the flared lower end portions of the partition walls; and developing the non-exposed portion to form said partition walls.

21. A method according to claim 20, wherein the region to which said second light exposure is applied includes a region corresponding to a connection band serving to connect adjacent partition walls.

22. An organic electroluminescence display element, comprising a light-emitting medium, a second electrode lines and a sealing layer, which are formed on a substrate according to claim 1.

23. A method of manufacturing a substrate for an organic electroluminescence display element, said substrate comprising a support having a plurality of color filters arranged thereon, a plurality of first electrode lines arranged apart from each other on said support, and a plurality of partition walls arranged on the support apart from each other and extending in a direction crossing said first electrode lines, each of said partition walls having eaves in an upper portion and flared side surfaces in a lower portion, said method comprising arranging said plurality of color filters apart from each other on said support to form rows and columns of the color filters; forming a plurality of said first electrode lines apart from each other on said color filters, said first electrode lines extending in a row direction of said color filters; forming a negative photoresist film on said first electrode lines; for the negative photoresist film, applying a first light exposure to expose first regions corresponding to the top portions including the eaves of partition walls to light, and a second light exposure, using the color filters as a mask, to expose second regions corresponding to the bottom portions of the partition walls positioned between adjacent columns of the color filters and to expose third regions corresponding to the clearances between adjacent rows of the color filters to light emitted from below the support; and developing the non-exposed portion to form partition walls connected to each other by a connection band corresponding to said third region.

24. A method according to claim 23, wherein said negative photoresist film contains a UV-absorbing substance.

25. A method according to claim 23, wherein said first light exposure and said second light exposure are conducted simultaneously.

26. A method according to claim 23, wherein said first light exposure and said second light exposure are conducted one before the other.

27. A substrate for an organic electroluminescence display element, comprising:
   a support;
   a plurality of first electrodes lines arranged apart from each other on said support; and
   a plurality of partition walls arranged apart from each other on said support and extending in a direction crossing said first electrode lines, each of said partition walls having eaves in an upper portion thereof and flares in a lower portion thereof, adjacent partition walls being connected to each other at the flare portions by a connection band,
   wherein said flares are longer than the eaves in a direction parallel to said support.

28. A substrate according to claim 27, wherein the partition wall main body, the eaves, the flares and the connection band are formed of the same substance.

29. A substrate according to claim 27, wherein said connection band covers the mutually facing side edge portions of adjacent first electrode lines.

30. A substrate according to claim 27, wherein each of said partition wall and said connection band is formed of a photoresist containing a UV-absorbing substance.

31. A substrate according to claim 30, wherein said UV-absorbing substance is black in color, and each of said partition wall and said connection band also perform the function of a black matrix.

32. An organic electroluminescence display element, comprising an organic electroluminescence medium and a second electrode line that are mounted on a substrate according to claim 27.

33. A substrate for an organic electroluminescence display element, comprising:
  a support;
  an insulating layer formed on said support, said insulating layer being inversely tapered;
  a plurality of first electrode lines arranged apart from each other on insulating layer; and
  a plurality of partition conductive bus lines extending substantially in parallel to said first electrode lines,
  wherein one side edge portion of each first electrode line extends over the surface of the adjacent conductive bus line.

34. A substrate according to claim 33, wherein one side edge of said insulating layer is in contact with said conductive bus line, and a clearance is formed between the other side edge of the insulating layer and the adjacent conductive bus line.

35. A substrate according to claim 34, wherein said clearance between the insulating layer and the adjacent conductive bus line has a width of 1 to 500 µm.

36. A substrate according to claim 34, wherein the clearance between the insulating layer and the adjacent conductive bus line is filled with an electrically insulating substance.

37. A substrate according to claim 33, wherein said insulating layer is formed of a negative photoresist containing a UV-absorbing substance.

38. A substrate according to claim 33, wherein said first electrode lines constitute an anode and said insulating layer constitutes a color filter layer.

39. A substrate according to claim 33, wherein said conductive bus line is formed of a metallic material selected from the group consisting of Ni, Cu, Cr, Ti, Fe, Co, Au, Ag, Al, Pt, Rh, Pd, Pb, Sn and alloys containing at least one of these metal elements.

40. A substrate according to claim 33, wherein said conductive bus line has a height of 0.1 to 100 µm and a width of 1 to 500 µm.

41. A substrate according to claim 33, wherein a light-absorbing layer is formed on that surface of the support which is in contact with said conductive bus line.

42. A substrate according to claim 33, comprising a plurality of partition walls crossing said first electrode lines, each of said partition walls having eaves in an upper portion and flared side surfaces in a lower portion.

43. A method of manufacturing a substrate for an organic electroluminescence display element, comprising forming a plurality of insulating layers that are inversely tapered on a support; forming a conductive material layer on substantially the entire surface of said support having said insulating layers formed thereon; forming a plurality of conductive bus lines each connected to only one side edge of each of the insulating layers by removing that portion of said conductive material layer which is positioned on said insulating layer such that the conductive material layer remaining on the surface of the support is in contact with said one side edge of the insulating layer and is separated from the other side edge of the insulating layer; and forming a plurality of first electrode lines by forming a first electrode layer on the support having the insulating layers and the conductive bus lines formed thereon, each of said first electrode lines being positioned on said insulating layer and extending over the conductive bus line connected to the insulating layer, and said plural first electrode layers being separated from each other at said other edges of the insulating layers.

44. A substrate for an organic electroluminescence display element, comprising:
  a support;
  a plurality of first electrode lines arranged apart from each other on said support; and
  a plurality of partition walls arranged apart from each other on said support and extending in a direction crossing said first electrode lines, each of said partition walls having eaves in an upper portion thereof and flares in a lower portion thereof;
  a frame surrounding said partition walls; and
  a cover disposed on said frame,
  wherein said flares of said partition walls are longer than the eaves of said partition walls in a direction parallel to said support.

45. A substrate according to claim 44, wherein said partition wall and said frame are formed of the same photosensitive material.

46. A substrate according to claim 44, wherein auxiliary electrode lines for connection to second electrode lines are formed apart from said first electrode lines on said support in a region between the edge of the support and a region surrounding the first electrode lines, said auxiliary electrode lines extending from within said frame to cross the frame to reach a region outside the frame.

47. A substrate according to claim 46, wherein said auxiliary electrode lines and said first electrode lines are formed of the same material.

48. An organic electroluminescence display element, comprising an organic EL medium and a second electrode line that are mounted on a substrate according to claim 44.

49. A display element according to claim 48, wherein a cover covering the region surrounded by said frame is disposed on said frame, and the pressure within the space surrounded by said cover and said frame is reduced, and said organic EL medium and said second electrode lines are sealed.

50. A display element according to claim 49, wherein the circumferential outer surface of said frame is coated with an adhesive, and said frame is bonded to said cover.

51. A display element according to claim 48, wherein a cover covering the region surrounded by said frame is disposed on said frame, and an inert gas is sealed in the space surrounded by said cover and said frame, and said organic EL medium and said second electrode lines are sealed.

* * * * *